US012232295B2

(12) United States Patent
Weisemann et al.

(10) Patent No.: US 12,232,295 B2
(45) Date of Patent: Feb. 18, 2025

(54) COMPUTING CENTER AND METHOD

(71) Applicant: Cloud &Heat Technologies GmbH, Dresden (DE)

(72) Inventors: Anne Weisemann, Dresden (DE); Conrad Wachter, Dresden (DE); Ricardo Buder, Dresden (DE); Jens Struckmeier, Dresden (DE)

(73) Assignee: WAIYS GMBH (DE)

( * ) Notice: Subject to any disclaimer, the term of this patent is extended or adjusted under 35 U.S.C. 154(b) by 6 days.

(21) Appl. No.: 17/754,683

(22) PCT Filed: Oct. 12, 2020

(86) PCT No.: PCT/EP2020/078596
§ 371 (c)(1),
(2) Date: Apr. 8, 2022

(87) PCT Pub. No.: WO2021/074071
PCT Pub. Date: Apr. 22, 2021

(65) Prior Publication Data
US 2024/0098933 A1    Mar. 21, 2024

(30) Foreign Application Priority Data
Oct. 15, 2019   (DE) ............. 10 2019 127 752.3

(51) Int. Cl.
*H05K 7/20*    (2006.01)
(52) U.S. Cl.
CPC ....... *H05K 7/20263* (2013.01); *H05K 7/2079* (2013.01)

(58) Field of Classification Search
CPC .......... H05K 7/20218; H05K 7/20245; H05K 7/20263; H05K 7/2079
See application file for complete search history.

(56) References Cited

U.S. PATENT DOCUMENTS 9,398,731 B1 *   7/2016   Imwalle ............. H05K 7/20736
2009/0133866 A1   5/2009   Campbell et al.
(Continued)

FOREIGN PATENT DOCUMENTS

| DE | 102017121365 A1 | 3/2019 |
| JP | 2012-042105 A | 1/2012 |
| WO | 2018/201425 A1 | 11/2018 |

*Primary Examiner* — Mandeep S Buttar
*Assistant Examiner* — Matthew Sinclair Muir
(74) *Attorney, Agent, or Firm* — BARNES & THORNBURG LLP; Jeffrey R. Stone

(57) ABSTRACT

Disclosed herein is a computing center that includes a computing system disposed in a chamber. The computing system includes a plurality of cooling elements and a plurality of processors, each processor thermally coupled to a cooling element of the plurality of cooling elements. The computing also center includes at least one heat pump disposed in the chamber; at least one gas-liquid exchanger disposed in the chamber. The also computing center includes a hot liquid circuit coupling the plurality of cooling elements to the gas-liquid exchanger, the hot liquid circuit further comprising a hot liquid connection on a wall of the chamber and a cold liquid circuit coupling the heat pump to the gas-liquid exchanger, wherein the heat pump is configured to extract thermal energy from the cold liquid circuit and supply it to the hot liquid circuit.

18 Claims, 14 Drawing Sheets

(56) References Cited

U.S. PATENT DOCUMENTS

| | | | |
|---|---|---|---|
| 2013/0205822 A1* | 8/2013 | Heiland | G01M 3/04 62/259.2 |
| 2014/0069111 A1 | 3/2014 | Campbell et al. | |
| 2019/0182990 A1* | 6/2019 | Chen | H05K 7/20736 |
| 2021/0271299 A1* | 9/2021 | Gauthier | H05K 7/20272 |

* cited by examiner

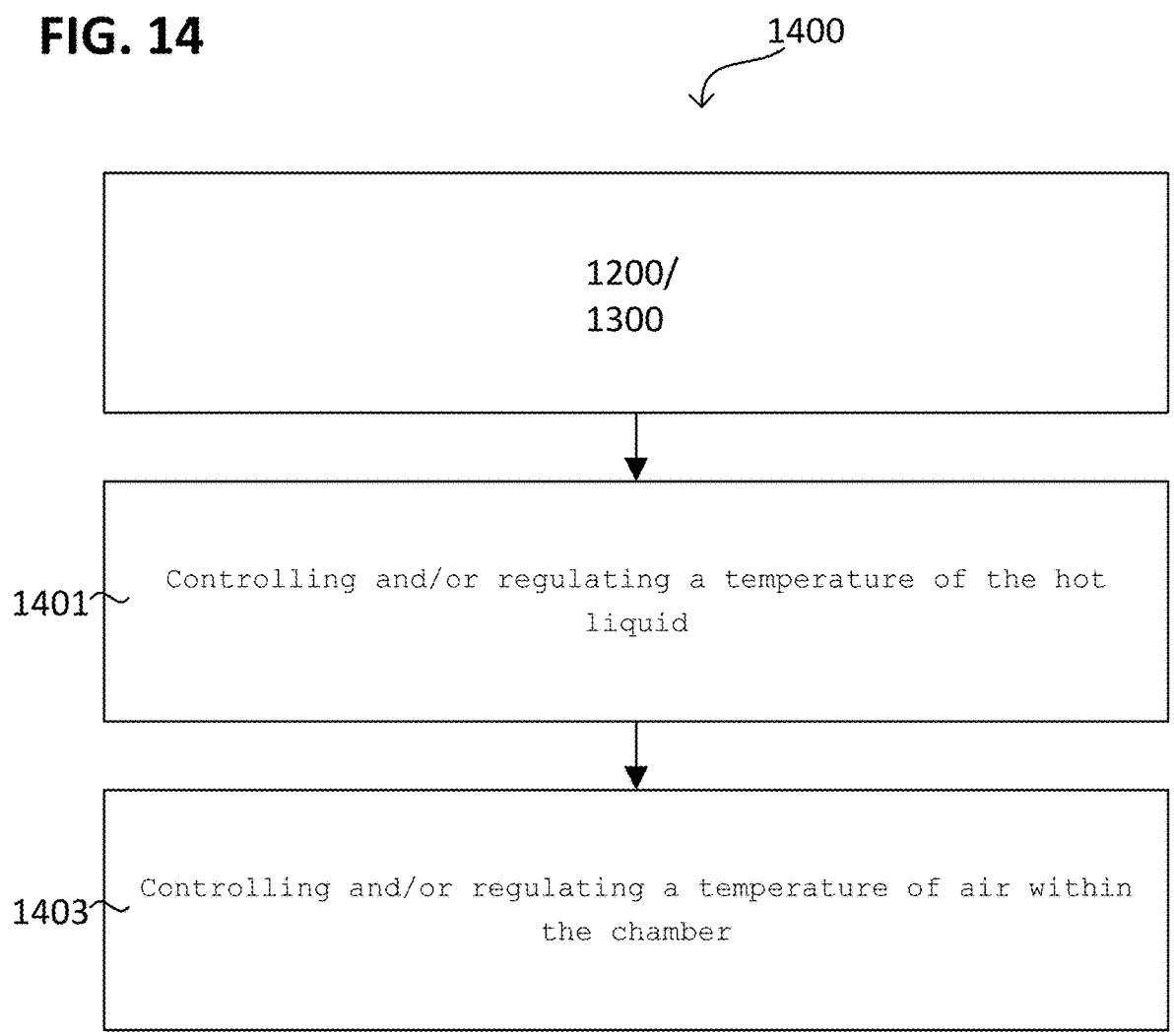

COMPUTING CENTER AND METHOD

CROSS-REFERENCE TO RELATED APPLICATION(S)

This application is a national phase of PCT/EP2020/078596 filed on Oct. 12, 2020, which claims priority to German Patent Application 10 2019 127 752.3 filed on Oct. 15, 2019, each of which are incorporated in their entirety herein by reference.

TECHNICAL FIELD

Various embodiments relate to a computing center and a method.

BACKGROUND

In general, computing centers are used to provide large computing power in a centralized manner. This often involves the use of thousands of processors. The high amount of waste heat generated by this requires a suitable cooling concept to dissipate the waste heat in an economical and ecological way. Traditionally, the focus is only on the efficiency of the heat removal.

Regarding various cooling concepts, reference is made to WO 2018/201 425 A1, which describes a data center cooling system, US 2009/0 133 866 A1, which describes a hybrid air and liquid coolant air conditioning unit, and US 2014/0069 111 A1, which describes a thermoelectrically assisted air and liquid cooling system.

According to various embodiments, it has been recognized that an air-based and/or hybrid (water/air-based) cooling concept is conventionally difficult to operate year-round because it relies on the presence of cool fresh air, which may only provide the required cooling capacity even in the summer months in a few climate zones. In addition, a direct exchange of air with the environment entails increased maintenance and energy costs due to the filters required. If an additional heat transfer with system separation to an external circuit takes place, the temperature of the medium to be cooled is lowered further and thus increases the requirement for the presence of a heat sink with low temperatures.

If no natural heat sink is available throughout the year, a compression refrigeration system is conventionally used. In this case, condensation may take place at a higher temperature level, but this requires additional space due to the need for an outdoor unit that transfers the heat from the refrigerant to the outside air. Furthermore, the coefficient of performance of refrigeration systems decreases at high outdoor temperatures, which results in increased electrical energy requirements.

Both conventional variants use air as the heat transfer medium. Due to the low density and heat storage capacity of air, the amount of heat that may be transported by means of the medium is limited. Increasing the air flow rate and lowering the inlet temperature are only technically feasible and economically viable to a certain extent. For this reason, the power density of conventional systems is usually limited to less than 3 kW (kilowatts) per rack, or at least to significantly less than 80 kW per rack.

SUMMARY

According to various embodiments, a computing center, for example for use as a containerized computing center, is provided that includes an improved infrastructure for dissipating thermal energy (also referred to as cooling infrastructure) out of the computing center. Illustratively, the cooling infrastructure enables the computing center to operate year-round and/or even in hot climates. Accordingly, a method of operating the computing center is provided.

Illustratively, the cooling infrastructure has two water circuits with different temperature levels that are coupled together by means of a heat pump. During operation, heat is extracted from the air inside the chamber by means of the lower temperature level (i.e. it is cooled). This heat is raised to a higher temperature level by means of the heat pump and fed into the higher temperature level, by means of which the heat is removed. The higher temperature level makes it easier to release the heat or to put it to economic use.

According to various embodiments, a computing center (also referred to as CC) may comprise: a computing system disposed in a chamber, the computing system comprising a plurality of cooling elements and a plurality of processors, each processor thermally coupled to a cooling element of the plurality of cooling elements; at least one heat pump disposed in the chamber; at least one gas-liquid exchanger disposed in the chamber; a hot liquid circuit coupling the plurality of cooling elements to the gas-liquid exchanger, the hot liquid circuit further comprising a hot liquid connection on a wall of the chamber; and a cold liquid circuit coupling the heat pump to the gas-liquid exchanger; wherein the heat pump is adapted to extract thermal energy from the cold liquid circuit and supply it to the hot liquid circuit.

To accommodate continuous growth, containerized computing centers may be used, where the components of a data center are arranged in a container. Such containers may be prefabricated and preinstalled by manufacturers ex works, thus enabling efficient modular construction of larger computing centers.

According to various embodiments, the chamber may be set up as a container. In this case, the data center may also be referred to as a container data center. The effect of the container form is greater mobility and modularity of the data center.

According to various embodiments, a containerized computing center (containerized CC) may comprise: a container and a computing system disposed within the container, the computing system comprising a plurality of cooling elements and a plurality of processors, each processor thermally coupled to a cooling element of the plurality of cooling elements; the container comprising at least one heat pump and a gas-liquid exchanger; a hot liquid circuit coupling the plurality of cooling elements to the gas-liquid exchanger, the hot liquid circuit further comprising a hot liquid connection to a wall (e.g., partition) of the container; a cold liquid circuit coupling the at least one heat pump to the gas-liquid exchanger; a cold liquid circuit coupling the at least one heat pump to the gas-liquid exchanger; and an air-liquid connection to the at least one heat pump. (e.g., partition) of the container; a cold liquid circuit coupling the at least one heat pump to the air-liquid heat exchanger; wherein the at least one heat pump is arranged to extract thermal energy from the cold liquid circuit and supply it to the hot liquid circuit.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosure. In the following description, various non-limiting embodiments are described with reference to the following drawings, in which:

FIGS. 12 to 14 each show a process according to different embodiments in a schematic flowchart.

DESCRIPTION

Figure 1:
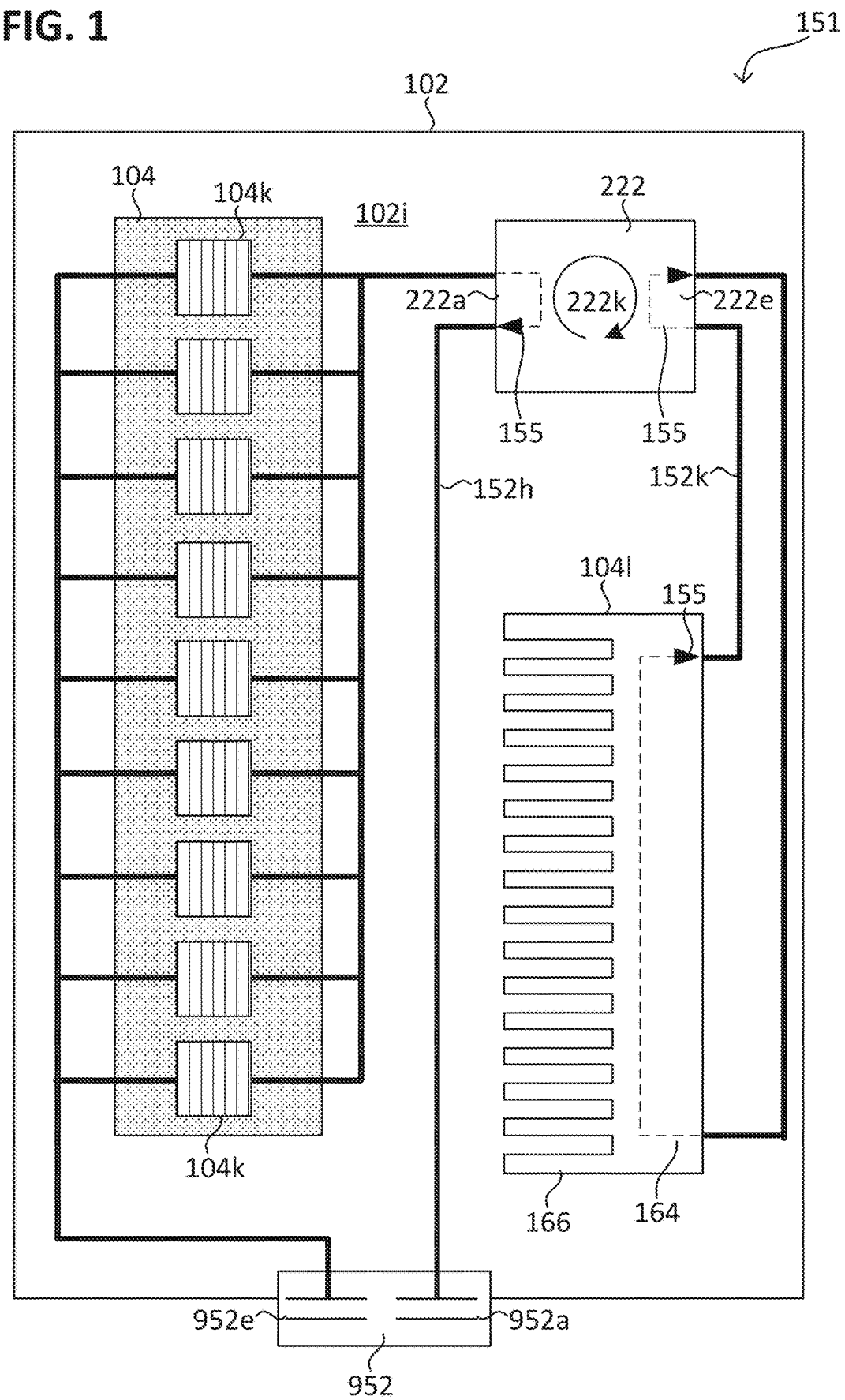
FIG. 1 shows a CC according to various embodiments in a schematic assembly diagram.

In the following detailed description, reference is made to the accompanying drawings which form a part thereof and in which are shown, for illustrative purposes, specific embodiments in which the invention may be practiced. In this regard, directional terminology such as "top", "bottom", "front", "rear", "frontwards", "rearwards", etc. is used with reference to the orientation of the figure(s) described. Since components of embodiments may be positioned in a number of different orientations, the directional terminology is for illustrative purposes and is not limiting in any way. It is understood that other embodiments may be used and structural or logical changes may be made without departing from the scope of protection of the present invention. It is understood that the features of the various exemplary embodiments described herein may be combined, unless otherwise specifically indicated. Therefore, the following detailed description is not to be construed in a limiting sense, and the scope of protection of the present invention is defined by the appended claims.

In the context of this description, the terms "connected", "attached" as well as "coupled" are used to describe both a direct and an indirect connection, a direct or indirect connection as well as a direct or indirect coupling. In the figures, identical or similar elements are given identical reference signs where appropriate. According to various embodiments, the term "coupled" or "coupling" may be understood in the sense of a (e.g. mechanical, hydrostatic, fluid-conducting, thermal and/or electrical), e.g. direct or indirect, connection and/or interaction. For example, multiple elements may be coupled together along an interaction chain along which the interaction (e.g., energy) may be transferred.

For example, two coupled elements may exchange an interaction with each other, such as a mechanical, hydrostatic, thermal, and/or electrical interaction. According to various embodiments, "coupled" may be understood in the sense of a mechanical (e.g., physical or physical) coupling, e.g., by means of direct physical contact. A coupling may be arranged to transmit a mechanical interaction (e.g., force, torque, etc.).

Control may be understood as an intended influencing of a system. In doing so, the state of the system may be changed according to a specification (also referred to as target state). Control may be understood as steering, where additionally a change of state of the system is counteracted by disturbances. Illustratively, the control system may have a forward control path and thus illustratively implement a sequential control system that converts an input variable (e.g., the target) into an output variable. However, the control path may also be part of a control loop, so that a closed-loop control is implemented. In contrast to pure forward control, closed-loop control features a continuous influence of the output variable on the input variable, which is effected by the control loop (feedback). In other words, closed-loop control may be used alternatively or in addition to open-loop control, or closed-loop control may be used alternatively or in addition to open-loop control. In the case of closed-loop control, an actual state of the controlled variable (ascertained, for example, on the basis of a measured value) is compared with a reference value (e.g., the desired state of the controlled variable) and, accordingly, the controlled variable may be influenced by means of a manipulated variable (using an actuator) in such a way that, as far as possible, a small deviation of the respective actual state of the controlled variable from the reference value results. The state of the system may, for example, be represented by at least one physical variable of the system. The open-loop and/or closed-loop control may be performed by means of a control device, which may, for example, be implemented separately from the computing system or as part thereof. The control device may be arranged to perform a method described herein.

Essentially 100% of the electrical power supplied to a computing center is converted to thermal energy (also referred to as heat for short). Most of the heat is typically generated in the servers by semiconductor devices within the servers. Other sources of heat in the data center include the electrical supply line, heat losses in the (hot water) lines, all electrical loads, and also fuses and electrical components in the power circuit. Consumers also include all regulation and control units, valves, dampers, as well as control electronics, lighting, network technology, fire protection systems, UPS, batteries, accumulators (especially during discharging and charging processes), as well as access controls and all security technology including burglary protection.

According to various embodiments, it has been recognized that it is not economically viable or even technically difficult to set up all of the above heat sources in a liquid-cooled manner. Accordingly, their waste heat is dissipated elsewhere. If the waste heat is not dissipated, the temperature inside a hermetically sealed chamber will rise continuously to well beyond the permitted operating limits. To counteract this, the CC may have a water-to-water chiller that feeds a warm water loop to cool the heat trapped in the air. In this case, the water-to-water chiller is operated as a heat pump, meaning that heat is fed into the warm water loop through the chiller's condenser. This means that the high space requirement for an outdoor unit is eliminated and, in addition, the reuse of waste heat is made possible. The heat sink may, for example, be kept at a constant temperature level all year round, which makes it possible to select the refrigerating machine together with its refrigerant in such a way that high efficiency may be achieved at this operating point.

According to various embodiments, a secondary air system may be provided comprising one or more than one fan. The secondary air system may be set up to draw air from the chamber and discharge it back into the chamber, for example without leading the air out of the chamber or exchanging it for other air, so that illustratively a self-contained air flow is provided within the chamber. For example, an air output in the range of 1000 to 11000 m³/h (cubic meters per hour) at a pressure of 50 to 200 Pa (Pascal) may be provided per fan, for example an air output in the range of 9000 to 11000 m³/h at a pressure of 75 to 175 Pa, or for example an air output in the range of 9800 to 10200 m³/h at a pressure of 100 to 150 Pa. A fan operating in this range has been found to be particularly energy efficient. For example, the fan may have an air output of 10000 m³/h at a compression of 100 to 150 Pa.

The computing system of the or each chamber includes one or more than one processing unit (e.g., a series of racks) configured to hold, for example, a plurality of processors and/or storage media at high density. Processors may be, for example, server processors (CPUs), graphics card processors (GPUs), cryptoprocessors, ASICs, FPGAs, TPUs (tensor processing units), or mining hardware for cryptocurrencies. Storage media may be mechanical hard disk drives (HDDs) or solid state drives (SSDs).

The computing system may have multiple racks (e.g., comprising processor racks and/or shelves) for high-density accommodation of a plurality of processors. In other words, the CC allows for a particularly efficient arrangement of processors that, on the one hand, allows for a high density of processors but, on the other hand, ensures adequate cooling of the processors. In various embodiments, the processors are arranged on corresponding processor cards, e.g., electronic boards with electronics necessary for the processor, which are held by means of the racks. Processor cards may be, for example, graphics cards. The high-density arrangement corresponds to an arrangement that allows, in various embodiments, processors, for example processor cards, to be arranged in a first rack and a second rack in at least one row each, for example at least 8, for example at least 10, for example at least 12, or for example at least 16 processors per meter.

The computing system may have multiple racks (e.g., between 5 to 16 racks) in which server hardware is installed. Each rack may, for example, have a server receptacle in accordance with a 19-inch standard or a 21-inch standard (e.g., the so-called "open computing standard"). The computing system may be arranged such that this is substantially liquid cooled.

In various embodiments, the racks are configured to allow processors to be accommodated in a plurality of horizontal rows across the entire height of the chamber. For example, suitable racks may be used for this purpose, for example for holding processor racks and/or servers, with the horizontal rows filling the entire interior height of the chamber, for example. In this way, a particularly high processor density and a particularly high number of processors are achieved.

In various embodiments, at least 30 processors, or processor cards, per m² (square meter), for example at least 60 processors, or processor cards, per m², for example at least 100 processors, or processor cards, per m², for example at least 150 processors, or processor cards, per m² may be arranged. For example, such an arrangement of processors, which corresponds to a high-density arrangement, may be achieved by a corresponding arrangement in several horizontal rows.

To supply the computing system, the CC may have multiple supply paths with a supply interface configured to supply at least one medium to the CC from outside. The medium may be, for example, a cooling fluid (e.g., a cooling liquid and/or a cooling gas), electrical power, and/or a communication signal (e.g., a network signal). Each supply path may be arranged to functionally interact with the computing system and to pass and/or exchange the respective supplied medium to and/or with the computing system. The set of supply and discharge paths within the chamber may also be referred to herein as infrastructure. Depending on the type of medium (cooling fluid, electrical power, and/or communications signal), the infrastructure may be referred to as cooling infrastructure, power supply infrastructure (e.g., power supply infrastructure), or telecommunications infrastructure. For example, the cooling infrastructure may be arranged to extract thermal energy from the computing system along the supply path (also referred to as cooling). Optionally, supply-critical supply paths or components of the chamber may be redundant.

Redundancy refers to the presence of functionally identical or comparable resources in a technical system, not all of which are normally required for trouble-free operation. Functional redundancy may mean that the supply paths required for operation are designed several times in parallel so that, in the event of failure of one supply path or in the event of maintenance, another supply path ensures uninterrupted operation. Optionally, the mutually redundant supply paths may be spatially separated from each other, e.g. by protective walls and/or spatial separation (e.g. by arranging them on opposite sides of the chamber) to ensure further safety.

Redundancy of an element used to operate the computing system (e.g., a supply path, a component thereof, or a processor) may be understood herein to mean, for example, that at least one functionally identical or comparable copy of the element is present, and the element and its copy are also set up in such a way that it is possible to switch between them, e.g., without having to interrupt the operation of the computing system. The element and its copy may then be arranged illustratively redundant to each other (also referred to as a mutually redundant pair).

Switching between two mutually redundant elements (e.g. from a first supply path to a supply path that is redundant to it) may be automated, for example, if a malfunction has been detected in the active element. The malfunction may be detected as critical, for example, meaning that it could lead to a failure or partial failure of the computing system. Switching may be performed, for example, by means of a failure switch (e.g., a transfer switch), e.g., automated. Pre-certification may require, for example, that the computing center have an at least partially redundant infrastructure. Alternatively or additionally, e.g., if only some of the typical data center components are located in the chamber itself (e.g., the transformers, generators, and uninterruptible power supply (UPS) may be centralized and/or located outside of it), the redundant components and supply paths may satisfy at least some of the requirements for pre-certification (e.g., the chamber may have two redundant electrical sub-distributions and two supply paths), so that pre-certification in principle certifies expected availability if outside the chamber also meets the requirements (e.g., Classified as "supports availability class x," where x=1, 2, 3, or 4). One effect of pre-certification is that once the containers are transported to the location of the CC, they no longer need to be certified. This makes it possible to put the data center into operation more quickly and with less effort at the destination.

According to various embodiments, the redundancy may be N+1 redundancy. N+1 redundancy means that the computing system requires a maximum of (e.g., exactly) N supply paths for operation, with at least N+1 supply paths in the chamber. The N+1th supply path may be set up as a passive standby supply path. If one of the N supply paths fails or needs maintenance, its function may be taken over by the N+1th supply path, e.g. without interrupting the operation of the computing system. If two of the N supply paths fail, this may result in a failure or partial failure of the computing system (corresponds, for example, to availability class "VK 3" according to DIN EN 50600 or "Tier 3" according to the North American standard of the Uptime Institute). This could be counteracted by using a higher redundancy, e.g. by designing the redundancy as parallel redundancy. In parallel redundancy, at least 2·N supply paths are available, e.g. 2·(N+1) supply paths (corresponding, for example, to availability class "VK 4" according to DIN EN 50600 or "Tier 4" according to the North American standard of the Uptime Institute).

Single-path supply routes without duplication of components, on the other hand, may comply with "VK 1" or "Tier 1", whereby further construction requirements (e.g. burglary protection, fire protection, etc.) may be defined in the standards in addition to the availability classes. The data center may, for example, be constructed in accordance with the "VK 2" or "Tier 2" standard or in accordance with the "VK 3" or "Tier 3" standard.

In various embodiments, the chamber has a hermetically (e.g., airtight) sealed and/or thermally insulated interior (also referred to as an air circulation area) in which air is disposed and/or flows. Thus, an exchange of air between the air circulation area and an exterior of the chamber is inhibited. For example, the air may be in physical contact with the computing center, one or more of the infrastructure, and/or the heat exchanger. The chamber may optionally be arranged to release the hermetic seal in response to an emergency event (e.g., fire outbreak). However, the hermetic seal may also be maintained (e.g., unidirectional) so that a gas extinguishing system located inside the chamber is more effective. For example, computing system may be arranged.

Herein are described various liquid circuits, in each of which a liquid circulates. The liquid may serve as a cooling medium, i.e. its flow may transfer thermal energy. The liquid circuits are distinguished according to their temperature level (illustratively the temperature of their liquid) into hot liquid or hot liquid circuit and cold liquid or cold liquid circuit. The liquid may, for example, contain or be formed from water. However, another liquid may also be used, e.g. oil, petroleum, ethanol or a liquid mixture of several liquids. Water has a very high specific heat capacity at low density, which improves the heat power extraction capability.

In various embodiments, the CC is equipped with a cold liquid circuit whose thermal energy (also referred to as heat for short) is supplied to the hot liquid circuit by means of the heat pump. One effect of this heat transport is that the waste heat generated by the computing operation may additionally be supplied with the waste heat of the air-cooled components of the chamber. Thus, it is possible that most (e.g., more than about 80%, 90%, or 95%) of the electrical power consumed in the data center is absorbed in the form of heat from the hot liquid. This improves the energy balance of the CC.

In various embodiments, the temperature level of the hot liquid circuit may allow application in local and district heating networks. In these networks, temperatures in the range of 80-130° C. are used. Waste heat from the CC may thus be supplied to such a network, e.g. via an interface that has one or more than one additional heat pump. By means of the mechanisms described above, a return temperature increase in the return of the local and/or district heating network may be achieved in a very energy-efficient way, thus significantly reducing the (mostly fossil fuel) consumption for the subsequent increase to the set temperature.

According to various embodiments, an outdoor computing center is provided (also referred to as an outdoor computing center). The CC may be based on a container and/or modular design. Furthermore, the outdoor CC may be a completely self-contained system that is insulated from the outside to reduce environmental influences such as thermal, humidity and particles, which increases the possible applications. For example, the outdoor data center may be set up largely independently of the climate zone.

For example, the amount of heat that the or each server dissipates into the liquid (e.g., water) as a percentage of the total electrical power input to the server may be greater than about 30%, e.g., about 50% or more, for example, in a range from about 80% to about 100%). Water as a cooling medium increases the maximum heat power that may be dissipated (also referred to as heat power extraction capability).

For example, the power input to the computing system may be at least about 100 kW (kilowatts), for example about 150 kW or more, for example about 200 kW or more, for example about 250 kW or more, or for example about 500 kW or more. In various embodiments, the power supply infrastructure may be adapted to provide powering the computing system with an electrical output of at least about the power consumption of the computing system (e.g., at least about twice thereof). In various embodiments, the cooling infrastructure may be arranged to provide, by means of the hot liquid circuit, a thermal power extraction capability of at least the power consumption of the computing system (e.g., at least twice thereof).

The data center may have at least one server rack (also referred to as a rack) whose computing equipment is primarily liquid cooled. The primary waste heat portion may be supplied to the main supply (referred to as the hot line) and may be supplied at the external interface (also referred to as the hot liquid connection) of the data center for waste heat recovery or very energy efficient cooling (e.g., open air cooling and/or hybrid cooling). A heat pump may be used to provide a low temperature level (of the cold liquid) to maintain the necessary operating temperatures of the electronic components. The heat pump may use electrical power to bring the cold liquid to the low temperature level (illustratively a small temperature), which in turn may be transferred to the air within the chamber through a gas-liquid exchanger. Pumping the heat by the heat pump using electrical energy generates thermal power in the heat pump that may be returned to the hot liquid circuit. Thus, it is possible, for example, with additional thermal insulation, to bind almost 100% of the generated waste heat in the hot liquid and, for example, to reuse it. The heat pump may optionally be designed redundantly in order to be able to avoid a server shutdown in the event of a heat pump failure.

According to various embodiments, a closed data center (e.g., comprising a container or other modular unit) is provided with predominantly liquid-cooled server components in combination with at least two complementary and redundant heat pumps. This data center is largely environment-independent with very low maintenance requirements and long trouble-free operation.

According to various embodiments, at least one of the two heat pumps may be a controllable heat pump. This enables the room temperature to be controlled according to a setpoint, e.g. in such a way that a different temperature is set for maintenance than for normal operation.

Optionally, there may be a water-side control that controls, for example, a shut-off valve downstream of a heat exchanger on the consumer side (i.e., room outlet side) so that a predetermined temperature (also referred to as the outlet temperature) of the hot liquid is kept constant. If the hot liquid temperature drops, the control valve may decrease the flow of hot liquid through the heat exchanger. This ensures that exactly as much energy is always dissipated on the water side as electrical energy is converted into thermal energy in the chamber.

According to various embodiments, the data center may comprise a chamber and, therein, at least one (single-row or multi-row) server row extending, for example, parallel to the long side of the chamber (e.g., a container) or perpendicular thereto. Optionally, the chamber may be subdivided by means of partitions into an electrical area, a hydraulic area, a network area, and a server area. Optionally, at least one heat pump may be provided per server row (e.g. computing unit).

FIG. 1 illustrates a CC 151 according to various embodiments in a schematic layout diagram. The CC 151 may include, within a chamber 102i (for example, a container 102), a computing system 104 that includes a plurality (e.g., at least 10, at least 100, or at least 1000) of processors, each processor coupled to a cooling element 104k. Each cooling element 104k may include a thermally conductive material (e.g., copper) that is penetrated by a cavity. Thermally conductive may be understood to include a body and/or material having a thermal conductivity greater than about 200 (or 300) watts per meter and Kelvin (W/m·K). Each of the cooling elements 104k may be in thermally conductive contact with one or more than one processor. A thermally conductive contact may have a thermal resistance of less than 1 K/W and/or be dielectric in configuration. The thermally conductive contact may be or may be provided, for example, by means of a polymer.

A heat pump 222 and a gas-liquid exchanger 1041 may be disposed within the chamber 102i. A heat pump 222 (also referred to as a power heat engine) may be understood as a device arranged to extract thermal energy from its colder input side 222e (also referred to as the cold side) and supply it (e.g., together with drive energy) to its warmer output side 222a (also referred to as the hot side). In various embodiments, the heat pump comprises a fluid circuit 222k for this purpose, in which a suitable fluid (e.g., a fluid that may reach a liquid as well as a gaseous state in the circuit 222k, e.g., propane) circulates. Components of the fluid circuit 222k include, for example, an evaporator, a throttle, a condenser, and a compressor. The fluid is selected, for example, to evaporate in the evaporator due to heat input from the input side 222e and, after being compressed (in the compressor), to re-condense in the condenser while releasing heat to the output side 222a. The throttle is used, for example, to allow controlled release of the fluid.

Heat exchanger 1041 may be understood as a device that transfers thermal energy from a first fluid stream to a second fluid stream. For example, the heat exchanger 1041 may be passively set up so that the heat flow is caused substantially only by the temperature difference between the first fluid stream and the second fluid stream. In a gas-liquid exchanger 1041 (also simplified as a heat exchanger 1041), the first fluid may be a liquid and the second fluid may be a gas. For example, the gas-liquid exchanger 1041 may include a conduit 164 through which the fluid flows and a plurality of fins 166 through which the gas (e.g., air) flows. The fins may be thermally coupled to the conduit 164, for example, by extending the conduit 164 transversely through the fins. The heat exchanger 1041 may be passively configured, for example.

Further, the CC 151 may include (e.g., within the chamber 102) a hot liquid circuit 152h and a cold liquid circuit 152k.

As used herein, a liquid circuit (e.g., the cold liquid circuit 152k or the hot liquid circuit 152h) may be understood to be a system configured to direct a liquid along a flow path 155 through the chamber 102. The liquid circuit may be coupled to at least one component (e.g., the heat pump 222) of the CC 151 such that the flow path 155 passes through that component, i.e., the liquid is supplied to and withdrawn from it. For example, multiple components (e.g., the heat pump 222 and the heat exchanger 1041) may be coupled in series with respect to the flow path 155. Alternatively or additionally, multiple components (e.g., the cooling elements 104k) may be connected in parallel with respect to the flow path 155. For example, a pump of the liquid circuit may serve as a reference point for this purpose.

The hot liquid connection 952 may include an inlet flange 952e and an outlet flange 952a. This allows the liquid of the hot liquid circuit 152h to be withdrawn from the chamber 102 (through the outlet flange) and returned to the chamber 102 (through the inlet flange). At the hot liquid connection 952, the flow path may optionally be interrupted or branched.

The cold liquid circuit 152k may generally have no connection or fewer connections to the exterior of the chamber 102 than the hot liquid circuit 152h.

The hot liquid circuit 152h may be coupled to the hot side 222a of the heat pump 222. The cold liquid circuit 152k may be coupled to the cold side 222e of the heat pump 222.

The cold liquid circuit 152k may couple the heat exchanger in series with the heat pump 222. The hot liquid circuit 152h may couple the plurality of cooling elements 104k in series with the heat pump 222.

In the following, reference is made to water as a hot liquid and a cold liquid for ease of understanding. In principle, however, another liquid or a mixture of several liquids may also serve as a hot liquid or cold liquid. Water has a high heat capacity and may therefore provide high efficiency.

The CC 151 may optionally include multiple such chambers 102, as will be described below. The components thermally and/or fluidically coupled to each other by means of the cold liquid circuit 152k and the hot liquid circuit 152h may be part of the cooling infrastructure 114.

In various embodiments, the or each heat pump 222 is a high temperature heat pump. Depending on the heat pump, heat may then be extracted from the cold liquid circuit 152k at a temperature (of the cold liquid) of, for example, at least 30° C., for example, at least 40° C., for example, at least 50° C., for example, at least 60° C., and this heat may be raised to a higher temperature level of, for example, at least 50° C., for example, at least 60° C., for example, at least 70° C. or 85° C., at which it is supplied to the hot liquid circuit 152h.

According to various embodiments, the chamber 102 may be arranged as a container 102. Then, the walls of the chamber may be the container walls, the floor of the chamber may be the container floor, and the ceiling of the chamber may be the container ceiling. In the following, reference is made to, among other things, a chamber 102 that is set up as a container 102, for example. By analogy, what is described may also apply to a differently furnished chamber 102, such as a chamber of a building and/or a chamber with walls made of stone.

Figure 2:
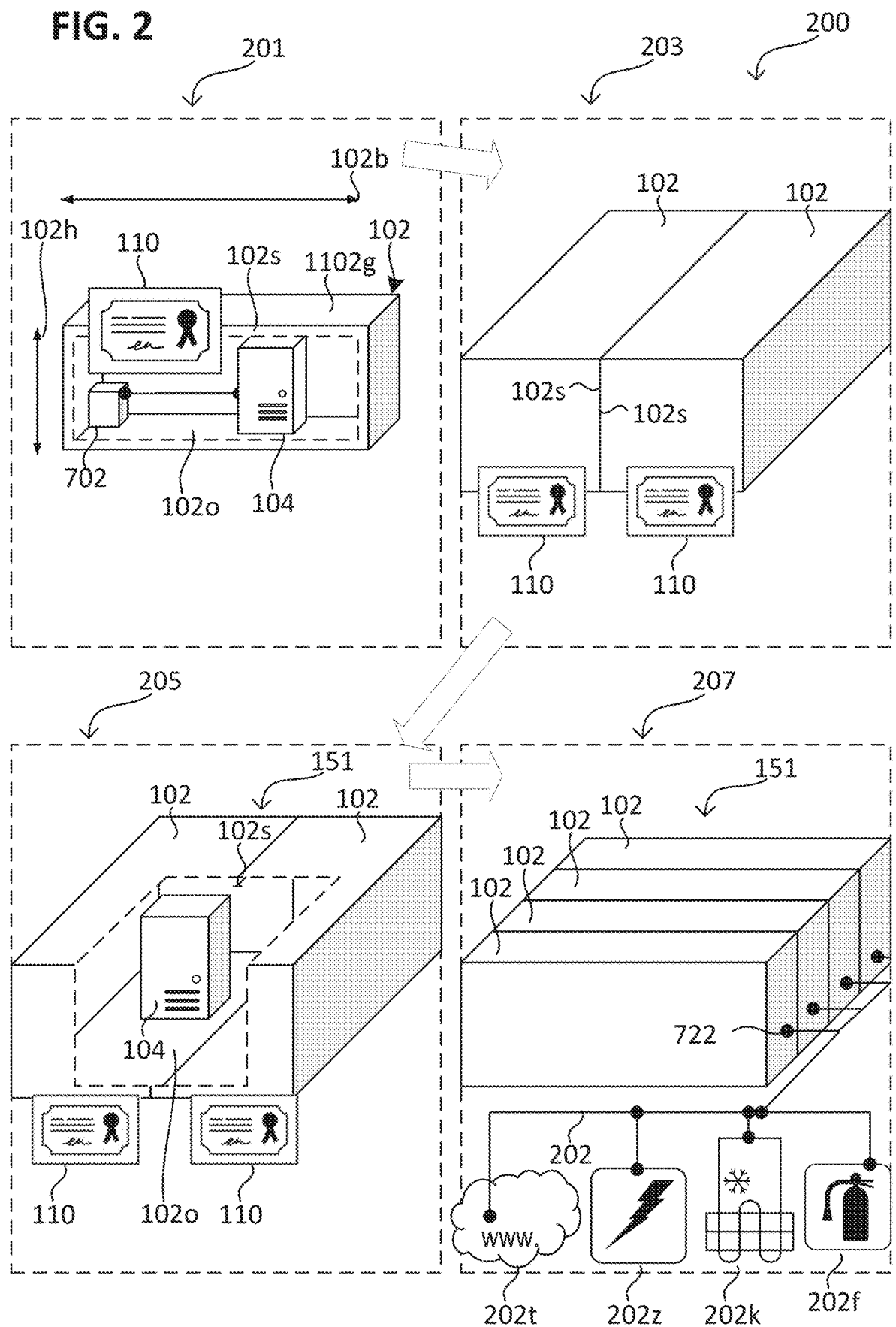
FIG. 2 shows a process according to various embodiments in a schematic flow diagram.

FIG. 2 illustrates a method 200 according to various embodiments in a schematic flowchart for handling a plurality of containers 102 of a container CC 151. Each container 102 may include a housing 1102g that may include contiguous (e.g., four) side walls, a top, and a bottom surrounding an interior of the container. Of the sidewalls of the container 102, a plurality of sidewalls 102s may optionally be substantially fully open (also referred to as loose walls 102s). The container 102 may further include one or more than one infrastructure 702 within the interior for distributing a medium. In the following, for ease of understanding, reference may be made more generally to an infrastructure 702 of the container 102, and what is described for the infrastructure 702 may apply to the power infrastructure, the cooling infrastructure, and/or the telecommunications infrastructure (e.g., by analogy). However, the same may apply by analogy to one or more than one of the other infrastructures 702 of the container 102.

The infrastructure 702 of the or each container 102 may be individually pre-certified 110 with respect to a reliability of the computing system 104. Optionally, multiple infrastructures 702 or the entire container may be pre-certified as part of a CC or the container may be pre-certified with additional technology containers.

Pre-certification 110 may illustratively represent a reliability of the computing system. For example, the reliability (also referred to as availability) may be greater than 95%, e.g., at least about 98.97%, e.g., at least about 99%, e.g., at least about 99.9% (also referred to as high reliability), e.g., at least about 99.99% (also referred to as very high reliability), e.g., at least about 99.999%. Reliability may be or become classified, i.e., divided into classes (also referred to as availability class), depending on the certification type.

For example, a pre-certification according to DIN EN 50600 (from 2013, e.g. DIN EN 50600-1 from 2013, or DIN EN 50600-2-2 from 2014 or DIN EN 50600-2-3 from 2015) and/or according to American Tier Classification (e.g. from 2015) may be used. However, other (e.g. commercial) certification types may also be used, e.g. a Bitcom certification (e.g. according to Bitcom guideline 2013) or an InfraOpt certification (from 2017). Depending on the certification type or availability class, different pre-certification requirements may be fulfilled, e.g. at least N+1 redundancy (or 2N redundancy) of the 702 infrastructure.

The method 200 may have in 101: Providing at least one (i.e., one or more than one) container 102. Providing 101 may optionally comprise in 103: Relocating the at least one container 102, e.g., to land, water, and/or air. The method 200 may optionally comprise in 103, for example: Arranging a plurality of containers 102 relative to each other such that any two containers 102 of the plurality of containers 102 are arranged immediately adjacent to each other. For example, they may be arranged with at least two (e.g., end or longitudinal) loose walls 102s facing each other. The method 200 may comprise, in 105, for example: Opening one of the plurality of loose walls 102s of the or each container 102 facing, for example, another container 102 of the plurality of containers 102. The or each container 102 may be configured such that when the loose wall 102s is opened, the pre-certification of the container 102 (e.g., its energy infrastructure 106) is maintained. To this end, the or each loose wall 102s of the container 102 may be, for example, free of elements that affect the pre-certification, e.g., that affect the fulfillment of the requirement according to the pre-certification. This may illustratively achieve that no certification of the container 102 is required after the interior of the plurality of containers 102 is connected. This speeds up the deployment of the CC 151 comprising the plurality of containers 102.

The method 200 may comprise in 107: Coupling the at least one container 102 to each other and/or to at least one external supply arrangement 202. The or each supply arrangement 202 may include one or more than one supply structure (also referred to as a supply), e.g., optionally a telecommunications supply 202t, optionally a power supply 202z, optionally a hot water supply 202k (more generally a hot liquid supply), and/or optionally a gas extinguishing supply 202f. Coupling of an infrastructure 702 may be more generally accomplished by means of a supply interface 722 to which the infrastructure has appropriate connections.

For example, the telecommunications infrastructure comprises a plurality of network lines coupling the supply interface 722 to the computing system 104 for connecting the plurality of processors to a local and/or global network (e.g., the Internet). For example, the cooling infrastructure 114 comprises a plurality of conduits (e.g., pipes for supply and return) that couple the supply interface 722 to the computing system so that thermal energy may be extracted from the interior of the container.

Figure 3:
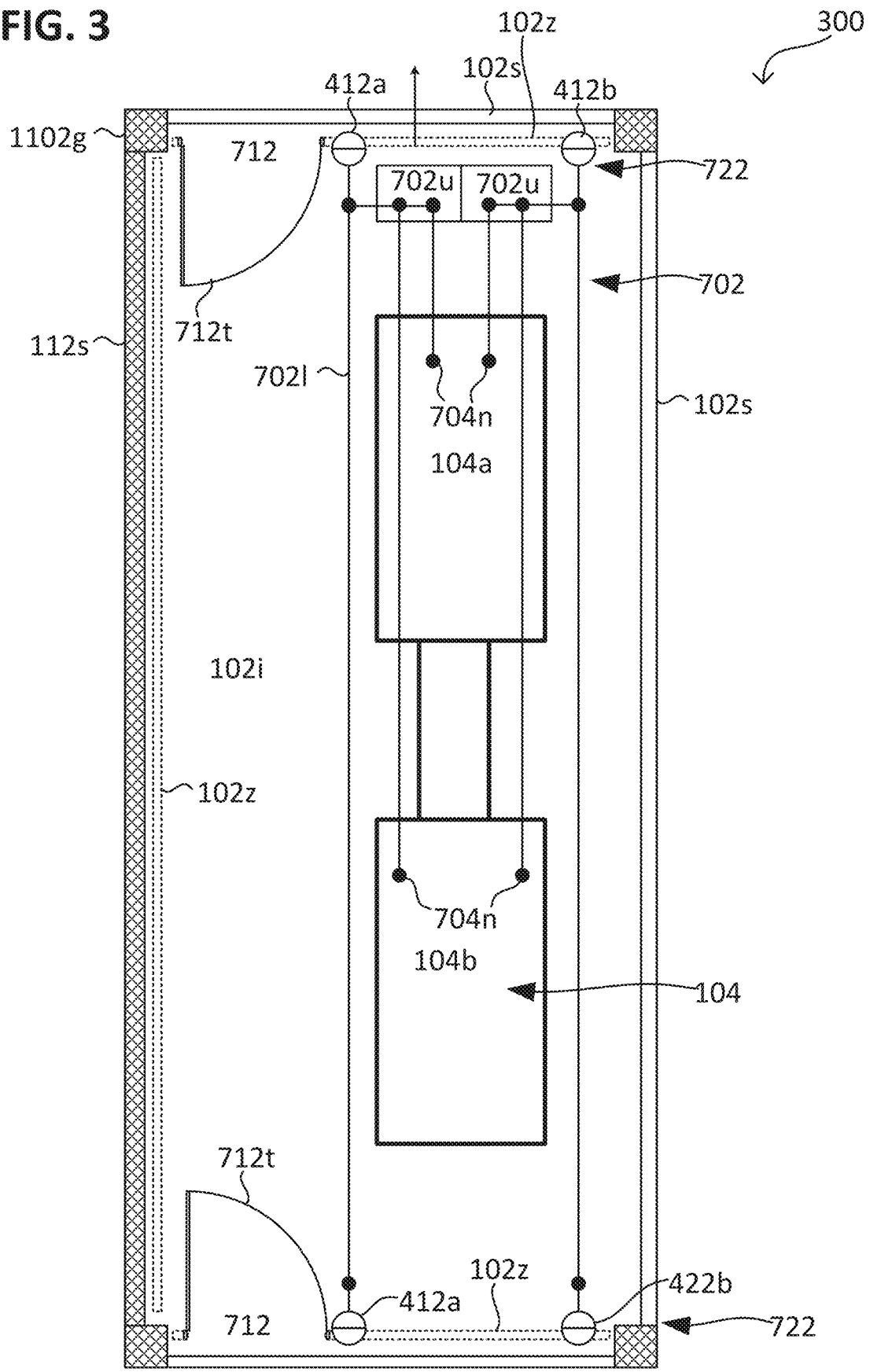
FIG. 3 shows a container CC according to various embodiments in a schematic layout diagram.

FIG. 3 illustrates a container CC 151 in accordance with various embodiments in a schematic body diagram 300. In the container CC 151, the or each chamber 102 may be a container 102.

The or each container (e.g. an ISO container) of the CC may, for example, be designed in accordance with ISO standard 668.

This has the effect that, in this regard, transport of the container on ships, railroads and trucks is standardized and thus easily possible. In various embodiments, the container may have an outer length of 13,716 m (45 ft), 12,192 m (40 ft, e.g. as a standard container or sea container), 9,125 m (30 ft), 6,058 m (20 ft, e.g. as a standard container or sea container), 2.991 m (10 ft), 2.438 m (8 ft) or 1.968 m (6 ft), have an outer height of 2.591 m (e.g. as a standard container) or 2.896 m (also referred to as a high-cube container), and an outer width of 2.438 m. For example, a so-called 20 ft container has an outer length of 6,058 m, an outer height of 2,591 m, and an outer width of 2,438 m. A so-called 40 ft container (e.g., 40 ft HC container) has an outer length of 12,192 m, an outer height of 2,896 m, and an outer width of 2,438 m. In one example, the container may have an outer dimension (length×width×height) of 6,058 m×2,438 m×2, 896 m. The container may have an inner dimension (length× width×height of the interior) of 5.853 m×2.342 m×2.697 m.

The housing 1102g of the container 102 may include at least two (e.g., three) movable walls 102s, optionally one or more than one fixed wall 112s. The fixed wall 112s may, for example, extend along a longitudinal extent of the container 102 and/or be disposed on a longitudinal side of the container 102. The fixed wall 112s and the second loose wall 102s (also referred to as longitudinal side walls) may be disposed opposite each other. Further, the first loose wall 102s and the third loose wall 102s (also referred to as front side loose walls) may be arranged opposite each other.

In one embodiment, each substantially fully openable side wall (also referred to as a loose wall) of the container is configured as a multi-leaf, foldable or demountable wall. Alternatively or additionally, the loose wall may be configured to be resealable in accordance with ISO standard 668, and/or the container may be indistinguishable from other containers. Thus, in this embodiment, shipping of the container may be facilitated with common carriers and shipping routes in a simple manner by means of trucks, trains and ships.

The container 102 may further include one or more than one infrastructure 702 (e.g., the power infrastructure 106, the cooling infrastructure 114, and/or the telecommunications infrastructure).

Further, the housing of the container 102 may include a plurality of partitions 102z, as described in more detail below. Each of the partitions may, for example, include thermal insulation and/or hermetically seal the interior 102*i* of the container 102.

For example, a respective end-face intermediate wall 102*z* may be disposed between the computing system 104 and the first lot wall 102*s* and the third lot wall 102*s*. The computing system 104 and/or the supply lines 7021 of the infrastructure 702 may be disposed between the two end-face partitions 102*z*. Each end-face intermediate wall 102*z* may optionally include a door opening 712 in which, for example, a door 712*t* (also referred to as a personnel door 712*t*) may be disposed. The personnel door 712*t* may be a security door. The security door 712*t* may be lockable, thermally insulated, and/or fireproof and/or smokeproof.

Further, the infrastructure 702 may include at least one pair (e.g., two pairs) of mutually redundant supply paths 702*u*, each pair of which couples the supply interface 722 to the computing system 104. For example, each computing unit 104*a*, 104*b* of computing system 104 may be coupled to a pair of mutually redundant supply paths 702*u*. To this end, the computing unit 104*a*, 104*b* may be configured, for example, to switch between a pair of mutually redundant infrastructure couplings 704*n* (e.g., per computing unit 104*a*, 104*b*) of the computing system 104. Alternatively or additionally, the infrastructure 702 may be arranged to switch between the mutually redundant supply paths 702*u* of a pair. The switching may be performed, for example, by means of an automatic failure switch.

For example, the or each supply interface 722 may include at least a pair of mutually redundant ports 412*a*, 412*b*, a first port 412*a* of which is coupled to the computing system 104 (e.g., each computing unit 104*a*, 104*b*) by at least a first supply line 7021, and a second port 412*b* of which is coupled to the computing system 104 (e.g., each computing unit 104*a*, 104*b*) by at least a second supply line 7021. Each of the supply paths may include, for example, a plurality of supply lines and/or a distribution unit that couples the plurality of supply lines to the supply interface 722.

Optionally, an additional partition 102*z* may be disposed on the fixed wall 112*s*, and may support one or more than one component of the container 102, such as the infrastructure 702, a user interface, or the like. The additional partition 102*z* allows the fixed wall 112*s* to remain unchanged and/or provides additional thermal insulation to the container 102.

One or more than one medium may be provided locally by means of the supply arrangement 202, e.g. hot water, a low voltage 400 V (alternating current—AC) generated from a medium voltage (by means of a transformer), an uninterruptible current (e.g. by means of a UPS), an optional extinguishing gas.

The infrastructure 702 may be set up to meet the requirements of availability class 2 or higher (e.g., availability class 3) with respect to the reliability of the computing system 104 and may be pre-certified accordingly, e.g., in accordance with Tier and/or in accordance with DIN EN 50600.

The enclosure structure (e.g., fixed wall) of the container 102 may be steel, which may optionally include one or more than one personnel door. The frame of the container may include four corner steel beams and their horizontal steel connecting beams (and optionally the floor structure), which are adjacent to the partitions 102*z*.

The power infrastructure 106 may include two separate sub-distribution devices 106*u* (DD) and/or cable trays separated from each other, for example, to meet the requirements of availability class 2 (e.g., Tier 2) and above (e.g., supplying UPS power A and B). The cable runs may be continuous throughout the container 102 in the raised floor to provide, for example, two supply paths that are mutually redundant in their path from the supply interfaces 722 at opposite ends of the container 102. Each supply path or DD 106*u* may be configured to provide a supply power of at least 250 kW (kilowatts) or less. For example, the cross-section of the supply lines of each supply path may be arranged to provide supply power at either 220 V (volts) or at 110 V. Alternatively, or in addition, each supply path of the power infrastructure 106 may be arranged to provide power of about 250 kW or more per 6 meter lengthwise extent of the container 102, and/or in aggregate provide about 500 kW or more (e.g., with less or no redundancy).

Figure 4:
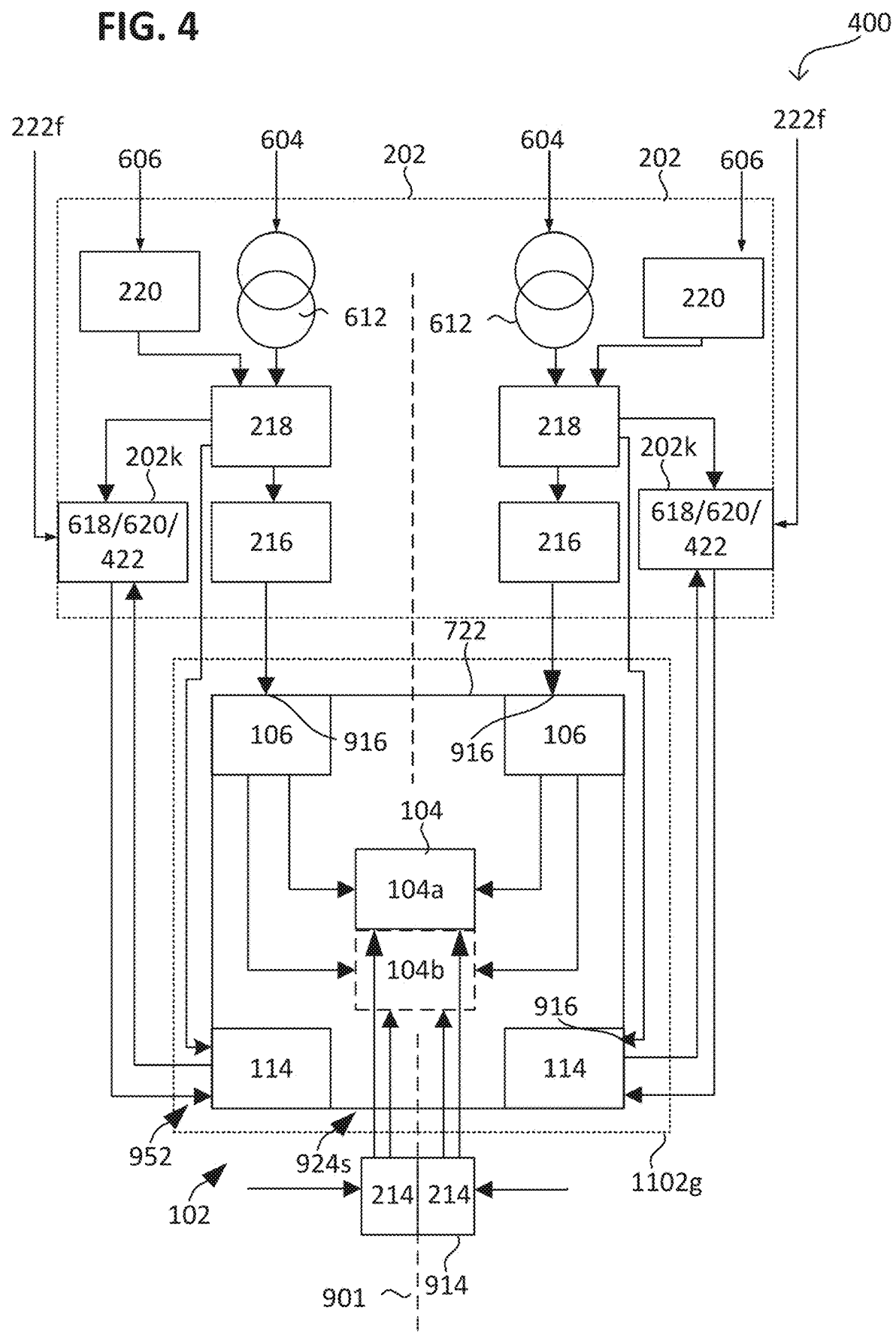
FIG. 4 illustrates a CC according to various embodiments in a schematic supply diagram.
Figure 5:
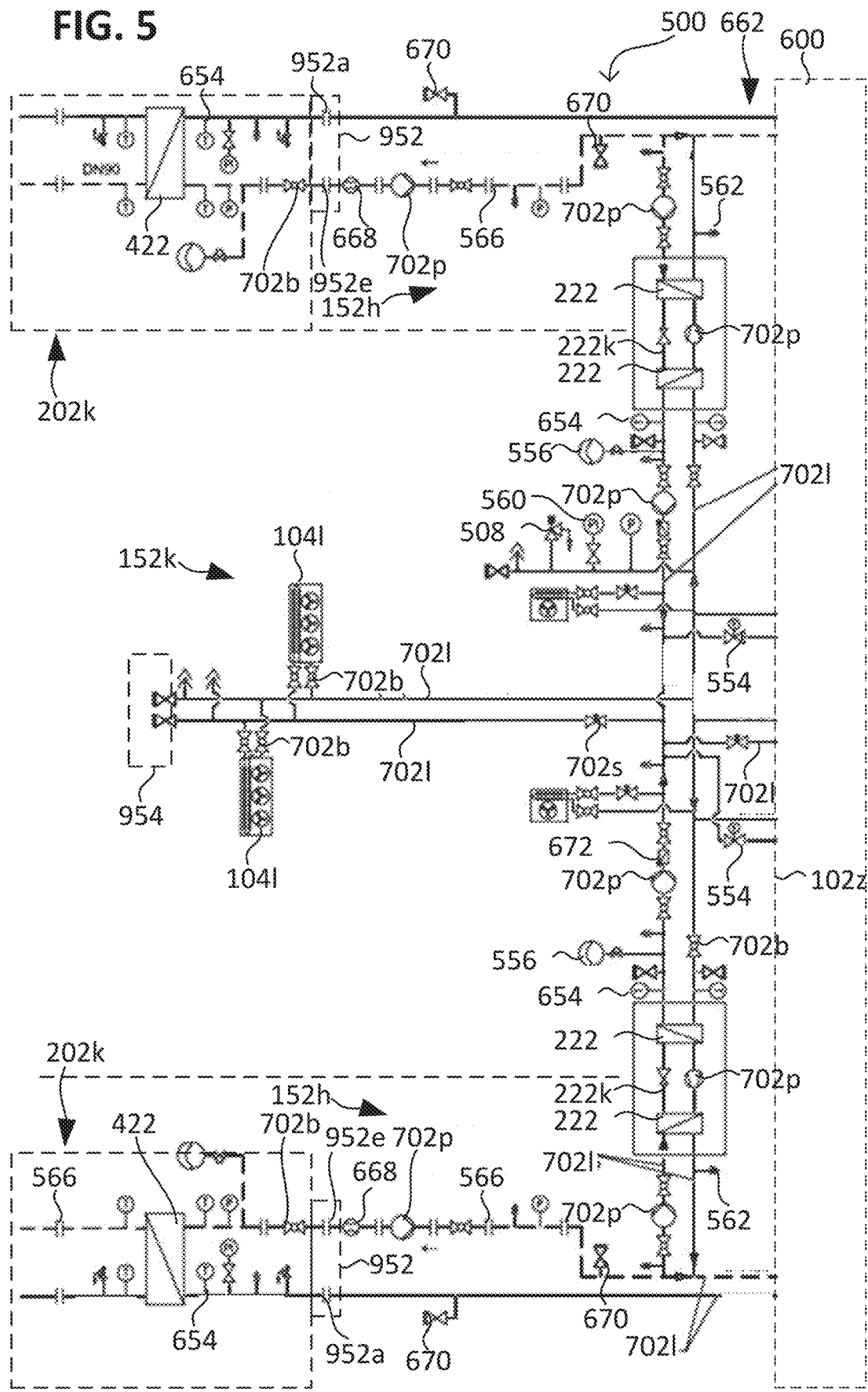
FIGS. 5 to 8 each show a CC according to different embodiments in various detailed body diagrams.
Figure 6:
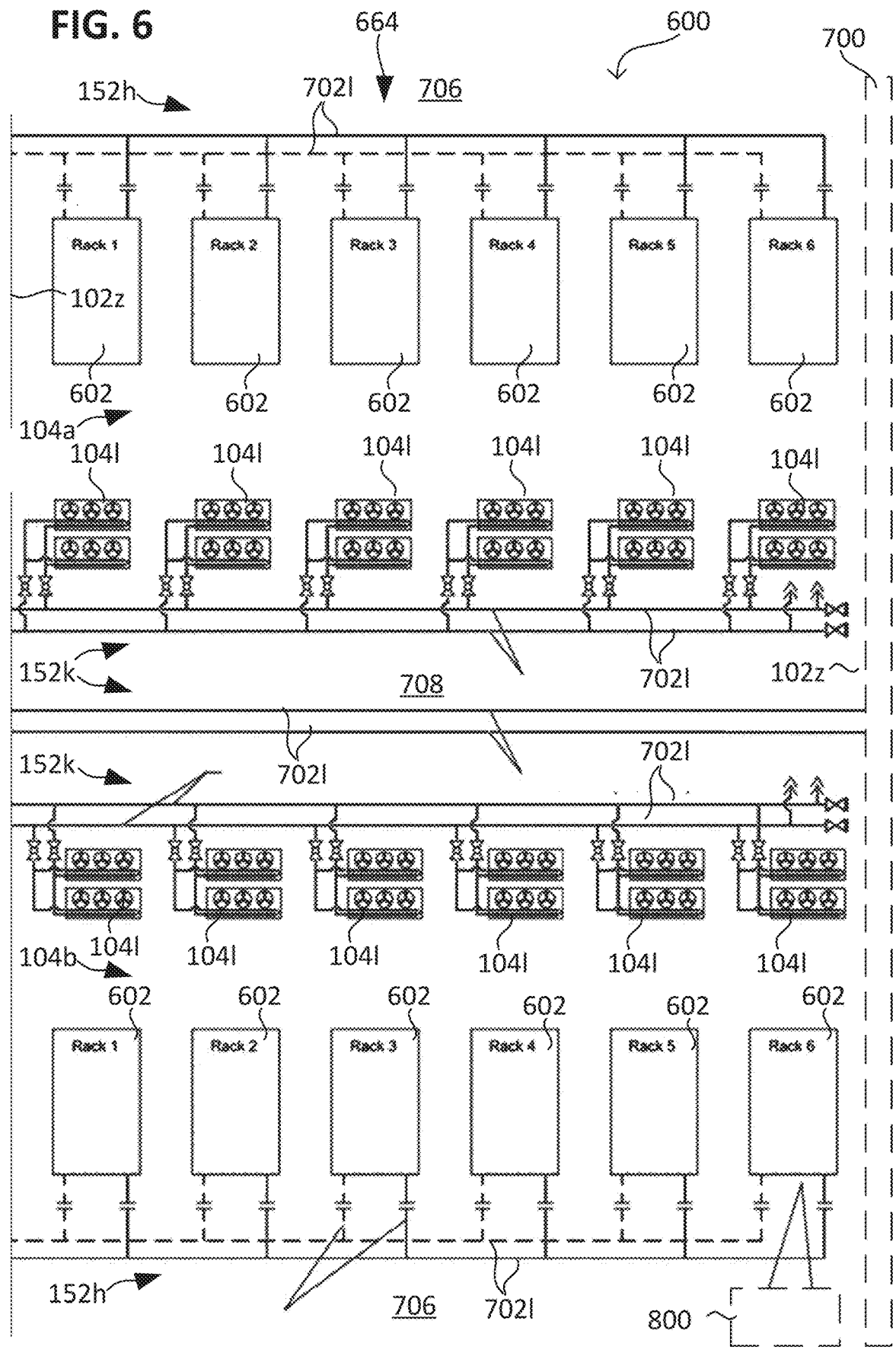
Figure 7:
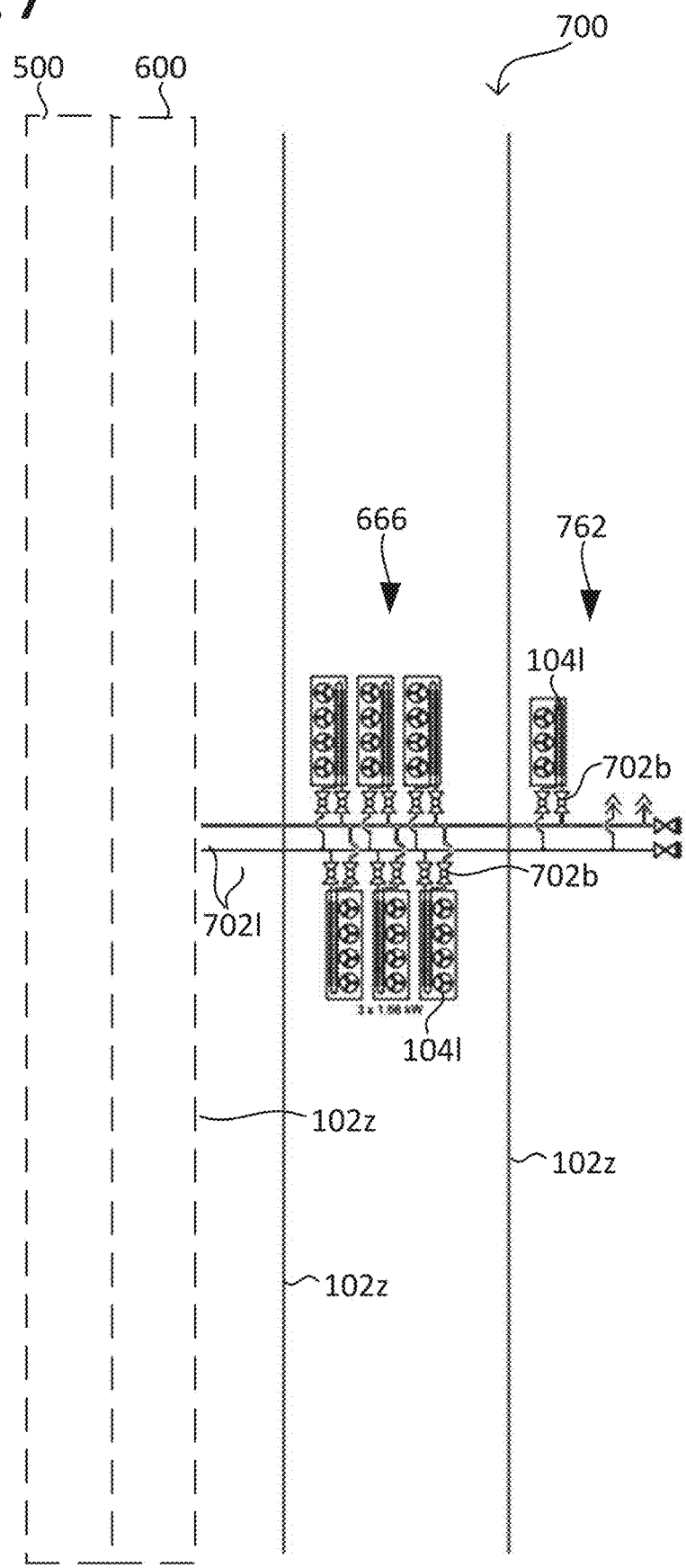
Figure 8:
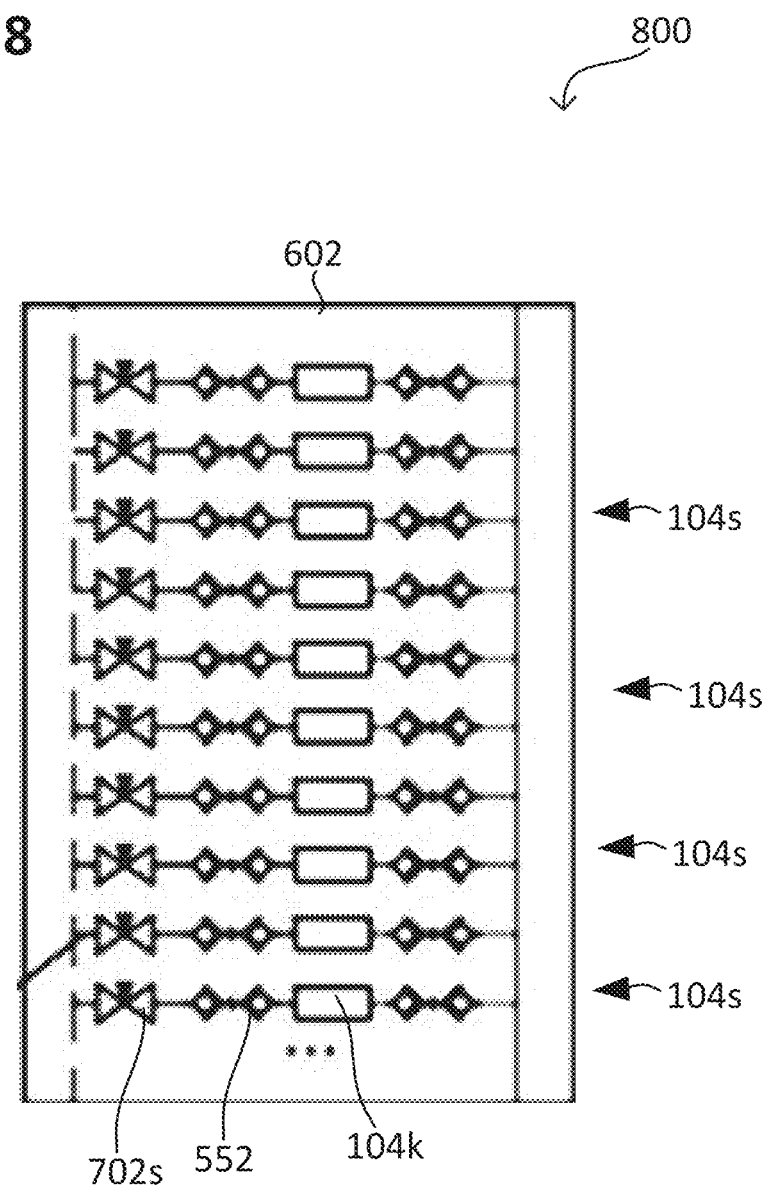

FIG. 4 illustrates a CC 151 according to various embodiments in a schematic supply diagram 400 with schematic redundancy pairing 901. The CC 151 may include a supply arrangement 202 and the chamber 102. However, the chamber 102 may be or may be provided without the supply arrangement 202. The supply arrangement 202 may include one or more than one supply module for supplying power to the CC 151, wherein the or each supply module may optionally include a container in which the corresponding supply structure is disposed. The supply interface 722 may be disposed on a wall of the CC 151, such as on a partition of the container 102.

The supply arrangement 202 may optionally be coupled to a medium voltage main distribution 604 and/or an optional fuel supply 606 (e.g., supplying gas or diesel). The supply arrangement 202 may include a plurality of modularly provided supply devices (also referred to as modules), e.g., a transformer 612, a power generator 220, a low voltage main distribution 218, an uninterruptible power supply 216, a normal power distribution 616, a hot water water supply 618, a cooling tower 620, and/or a heat pump system 422. In addition to the heat pump system 422, e.g., as an alternative to the cooling tower 620, a district or local heat line 222*f* may be connected to provide waste heat for a use.

The cooling infrastructure 114 (e.g., comprising the air conditioning 1041) may optionally comprise at least one pair of mutually redundant supply paths, each supply path of which comprises a hot water connection 952 (e.g., comprising flanges) at the supply interface 722. The power infrastructure 106 may optionally include at least one pair of mutually redundant supply paths, each supply path including at least one sub-distribution device 106*u* (DD) and/or at least one power supply connection 916 at the supply interface 722.

For example, the telecommunications module 202*t* may include two mutually redundant telecommunications ports 214. Accordingly, the telecommunications infrastructure may include at least one pair of mutually redundant supply paths, each supply path including at least one network line and/or network port at the supply interface 722 (e.g., using telecommunications interface 924*s*). Each computing unit 104*a*, 104*b* of the computing system 104 may optionally be coupled to each pair of mutually redundant supply paths of the telecommunications infrastructure 914, the power infrastructure 106, and/or the cooling infrastructure 114.

For example, the CC 151 according to supply diagram 400 may meet the requirements of availability class 3.

FIG. 5, FIG. 6, FIG. 7, FIG. 8 each illustrate a CC 151 (e.g., container CC 151) according to various embodiments in various detailed body diagrams 500 to 800.

According to various embodiments, a compact, enclosed, highly energy-efficient, and preferably low-maintenance reliable data center 151, e.g., a mobile containerized data center 151, is provided. To this end, a cooling infrastructure 114 is provided that enables the heat generated to be trapped in the liquid, thereby isolating the computing equipment from the environment.

The thermal and mechanical isolation of the computing units 104a, 104b from environmental influences allows for extremely energy-efficient operation and great flexibility in feasibility in a wide variety of climates and weather conditions. In addition, the use of the cooling infrastructure 114 enables energy-efficient utilization of the heat generated for industrial processes or a building supply through district heating.

The CC 151, e.g., its hot liquid cooling system, includes one or more than one hot liquid circuit 152h, each hot liquid circuit 152h of which feeds to the server racks 602 of the computing system 104. Optionally, one or more than one heat exchanger 1041 may be located at either the chassis level or the rack level. One or more than one heat pump 222 may be used to extract waste heat that is released to the air.

Components of a liquid circuit (e.g., the hot liquid circuit 152h and/or the cold liquid circuit 152k) may include: a plurality of supply lines 7021 (e.g., piping), one or more than one valve 702b (e.g., ball valve), and/or one or more than one pump 702p. Optionally, the liquid circuit may include one or more than one of the following: one or more than one flow sensor 702s, one or more than one quick coupling 552, one or more than one flow actuator 554, one or more than one expansion tank 556, one or more than one relief valve 558, one or more than one pressure sensor 560, one or more than one flange 566, one or more than one vent 562, one or more than one temperature sensor 654, one or more than one flow sensor 668, one or more than one fill valve 670, and/or one or more than one check valve 672. Each pair of supply lines 7021 that provides a flow path through the heat pump 222 may provide a supply path.

The or each quick coupling 552 may optionally include a valve (e.g., check valve) that acts to stop flow when the quick coupling is uncoupled.

By means of one or more than one partition 102z, multiple (e.g., spatially and/or thermally) separated (e.g., gas-separated) areas may be provided, e.g., a first area 662 in which the at least one heat pump 222 is disposed, e.g., a second area 664 in which the computing system 104 is disposed, e.g., a third area 666 in which the DD or network is disposed, e.g., a fourth area 762 which provides an airlock. Optionally, a heat exchanger 1041 may be disposed in each of these areas.

The or each heat exchanger 1041 may be part of a secondary air system, for example, which further includes at least one fan. The fan may be arranged to blow air from the corresponding area through the heat exchanger 1041 into the area. To be distinguished from recirculated air is secondary air, which is extracted from a chamber or area and, after cooling thereof, is returned to the same chamber or area.

For example, the liquid supply of the utility arrangement 202 may include one or more than one additional heat pump 422.

Optionally, instead of a single heat pump 222, two mutually redundant heat pumps 222 may be used. Alternatively or additionally, instead of a single heat pump 222, two cascaded heat pumps 222 may be used. For example, two pairs of heat pumps 222 may be set up to be redundant to each other, with the heat pumps 222 of each pair set up to be cascaded to each other. In two cascaded heat pumps 222, the hot side of one heat pump may be coupled to the cold side of the other heat pump, for example by means of a fluid circuit 222k. The heat pumps 222 cascaded in this manner may act together as one larger heat pump 222 providing a greater temperature differential. In the case of two redundant heat pumps 222, their hot sides may be coupled together and their cold sides may be coupled together, e.g., each by means of liquid circuit 152h, 152k decoupled thereto.

The one or more than one heat pump 222 may allow heat to be extracted from the air without the need for a conventional air conditioning system that requires, for example, an exhaust vent to the outside.

The or each (e.g., at least one) heat pump 222 may optionally be controllable (also referred to as modulatable), meaning that its pumping power may be set and/or controlled. For example, the pumping power may be dependent on an operating point of the heat pump 222, wherein the operating point of the heat pump 222 may be changed by means of an actuator (e.g., a power controller). For example, the modulatable heat pump 222 may be provided multiple operating points, such as at least three (e.g., at least ten), or may be continuously varied in its operating point.

Alternatively (e.g., if closed-loop control is not possible) or additionally, a hot fluid recovery system or a cold buffer tank may be coupled to the heat pump 222. Alternatively or additionally, the heat pump 222 may be operated in a cycled manner such that its pumping capacity is a time average over multiple cycles.

The cold liquid circuit 152k (also referred to as a cold liquid network or cold liquid piping) may extract heat from the at least one heat exchanger 1041. For example, one or more than one of the heat exchangers 1041 may be disposed within or adjacent (e.g., above) a server rack 602. For example, one or more than one of the gas-liquid exchangers 1041 may be disposed in a wall (e.g., floor, ceiling, and/or side wall) of the chamber 102. For example, one or more than one of the gas-liquid exchangers 1041 may be arranged as a so-called sidecooler (i.e., adjacent to the racks) or, alternatively or additionally thereto, as a so-called frontdoor cooler or so-called backdoor cooler.

If one or more than one gas-liquid exchanger 1041 is disposed above the racks 602 (e.g., above each rack 602), this also enables a separation (illustratively a gas separation) between hot aisle 706 and cold aisle 708. The cold aisle 708 may be disposed at the front of the servers, whereas the hot aisle may be disposed at the rear of the servers.

If the CC 151 has exactly one heat pump 222 or two mutually redundant heat pumps 222, the cold liquid circuit 152k may include a fresh water heat exchanger that additionally cools the servers. Then, as an alternative or in addition to the heat pump 222, the cold liquid circuit 152k may be cooled by means of the fresh water heat exchanger through which fresh water (for example, having a temperature between 5 and 15° C.) flows from outside the chamber 102. The fresh water may be taken, for example, from a body of water, a municipal water supply, or groundwater. A heat exchanger may then be included in the cold liquid circuit 152k for system separation, with the cold liquid flowing through the heat pump 222 as an alternative or in addition to the heat pump 222.

On the output side, the CC 151 (e.g., container thereof) has substantially the following interfaces: a power connection 916, a cold liquid connection 954 (e.g., for water having a temperature between 4° C. and 60° C.), and a hot liquid connection 952 (e.g., for water having a temperature between 35° C. and 95° C.). For example, the hot liquid connection 952 may receive water having a temperature in a range of about 45° C. to about 55° C. and may dispense water having a temperature in a range of about 60° C. to about 70° C. or more.

The one or more than one heat pump 222 and the computing system processors 104 feed thermal energy into the hot liquid circuit 152*h*, providing a flow of heat from the or each heat pump 222 and computing system out of the chamber 102. In this regard, the feed to the heat pump 222 may be upstream of the servers 104*s*, downstream of the servers 104*s*, or in parallel with the servers. According to various embodiments, the heat flow may be controlled and/or regulated.

For example, the control may be such that the cooling of the servers 104*s* and any other components of the data center 151 (e.g., within the chamber 102) is highly reliable and has control priority.

For example, control may be performed such that the chamber temperature (e.g., air temperature) is set to a value (set point) that is less than the maximum operating temperature of all components used within the chamber 102. The highest possible chamber temperature (RT) results in energy efficient operation of the heat pumps 222, i.e., a high coefficient of performance (COP) is achieved. Alternatively or additionally, a preferably high RT minimizes conduction heat losses from all water lines of the hot liquid circuit 152*h*. For example, there may be a flow of heat from the room air into colder liquid lines of the hot liquid circuit 152*h* and/or the cold liquid circuit 152*k*.

The control also allows the room temperature to be lowered further for maintenance purposes to provide moderate working conditions for maintenance. For example, a RT of less than 35° C. may be or will be provided for maintenance.

The CC 151 may optionally comprise the airlock 762 to be more independent of external influences, e.g. weather conditions such as snowfall and/or sandstorms. One or more than one container CC 151 may be placed, for example, inside a building or outdoors.

The chamber 102 (e.g., the housing 1102*g* of the container 102) may comprise a closed, thermally separating shell, such as comprising or formed from an insulating material (e.g., comprising fibers and/or a foam). For example, the enclosure 1102*g* of the container 102 may comprise or be formed from (for example) a bio-substitute plastic, such as WPC. For example, the housing 1102*g* may be prefabricated, such as in accordance with an ISO container standard.

The rack of the computing system 104 need not necessarily include racks or server cabinets, but may, for example, include only a frame structure and optionally hold a power distribution and water distribution system for the computing system 104. The interior of the chamber 102 may serve to supply cold air via heat exchanger 1041, which may be coupled to the cold side of the heat pump(s) 222 via the cold liquid circuit 152*k*, thus acting as a heat source for the heat pump(s) 222. Thus, lossy electrical components are adequately cooled and the heat generated is trapped in the cooling medium of the cold liquid circuit 152*k*. This enables a subsequently very efficient heat removal, e.g. a heat reuse in industrial processes or the heating of buildings by district heating.

Figure 9:
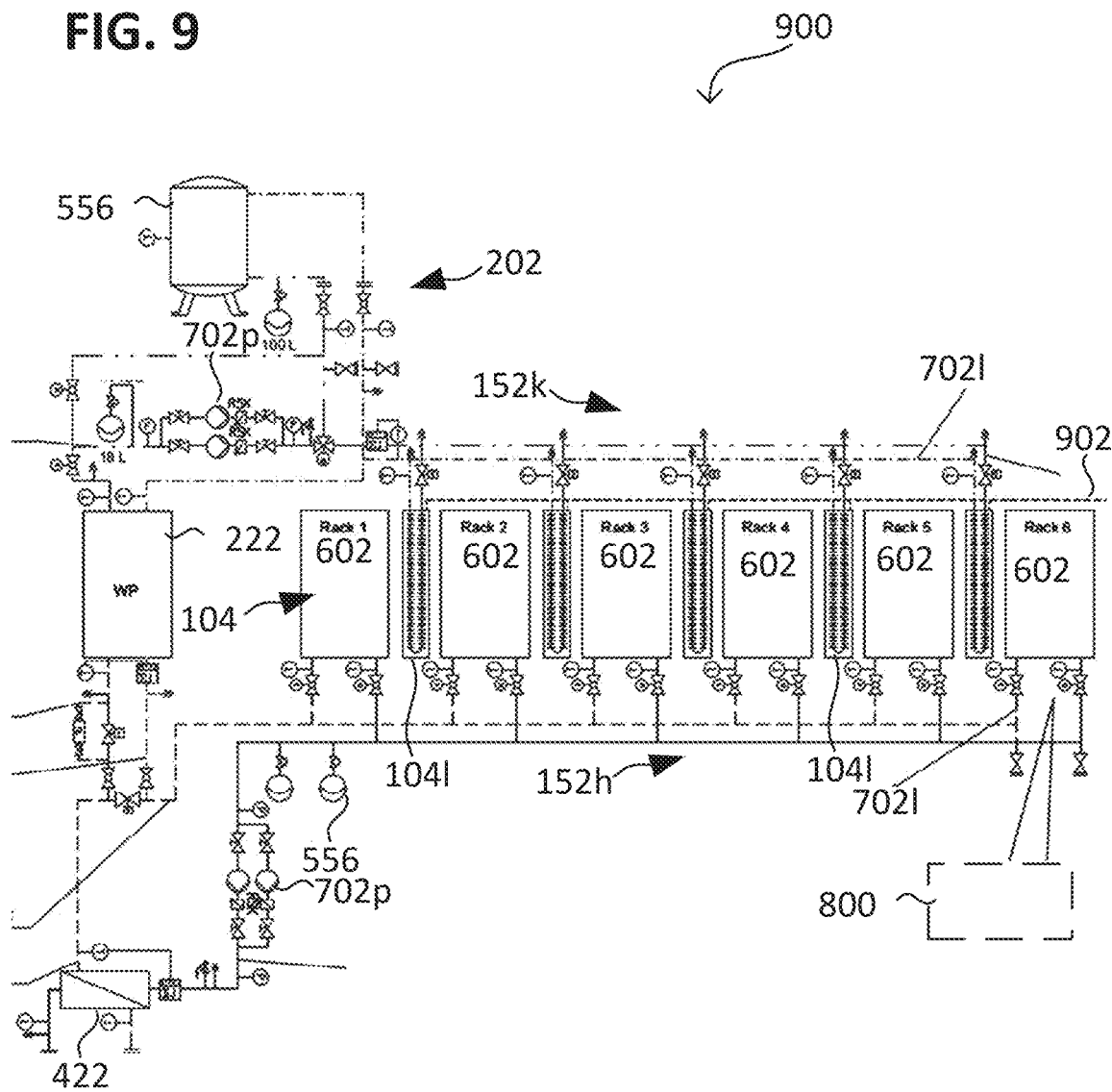
FIG. 9 shows an CC according to various embodiments in a schematic assembly diagram.

FIG. 9 illustrates a CC 151 according to various embodiments in a schematic body diagram 900. The CC 151 may include exactly one heat pump 222 in body diagram 900. The heat exchangers 1041 may be part of passive heat sinks.

Figure 10:
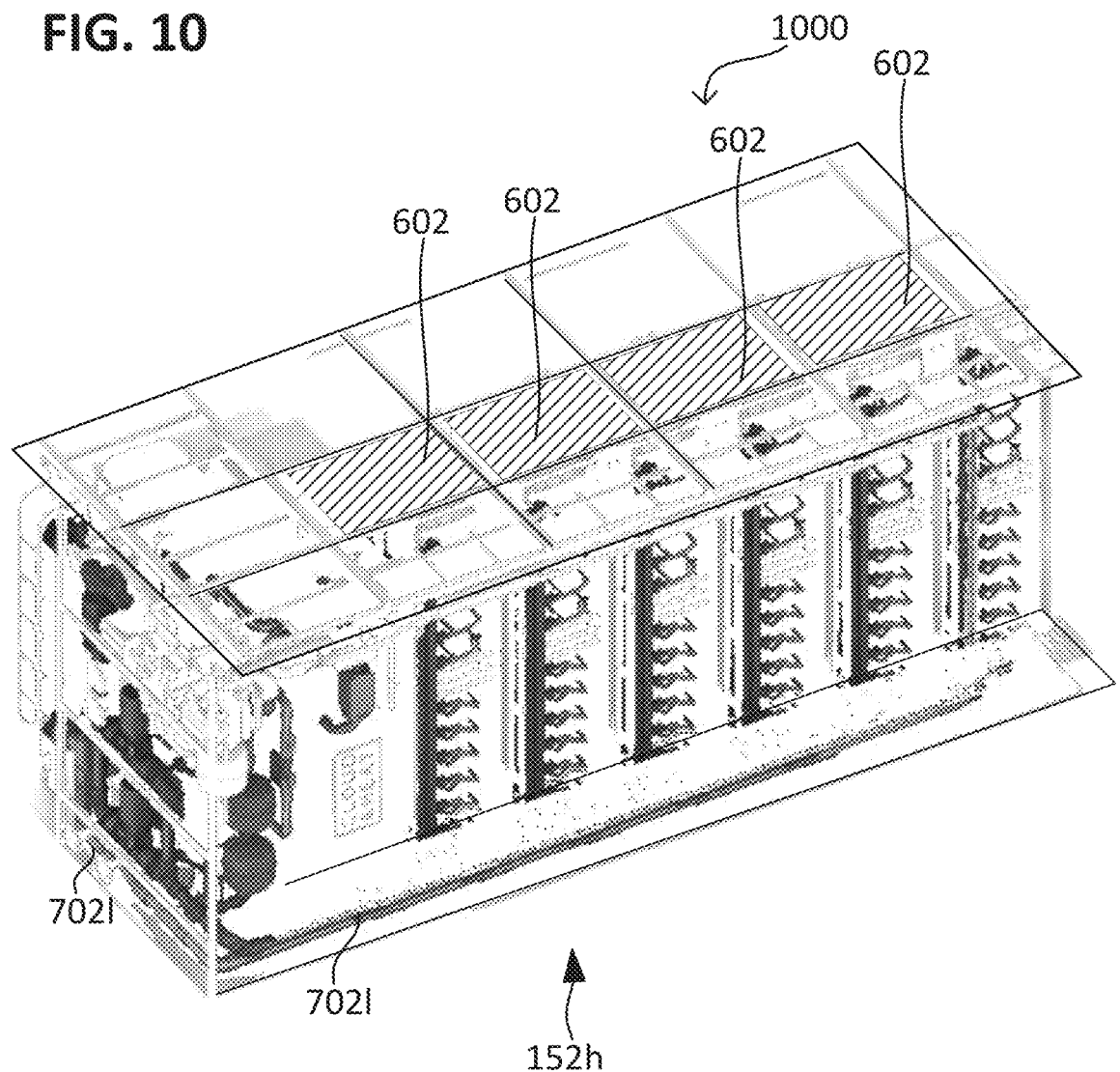
FIGS. 10 and 11 illustrate, respectively, a container CC according to various embodiments in a schematic perspective view.
Figure 11:
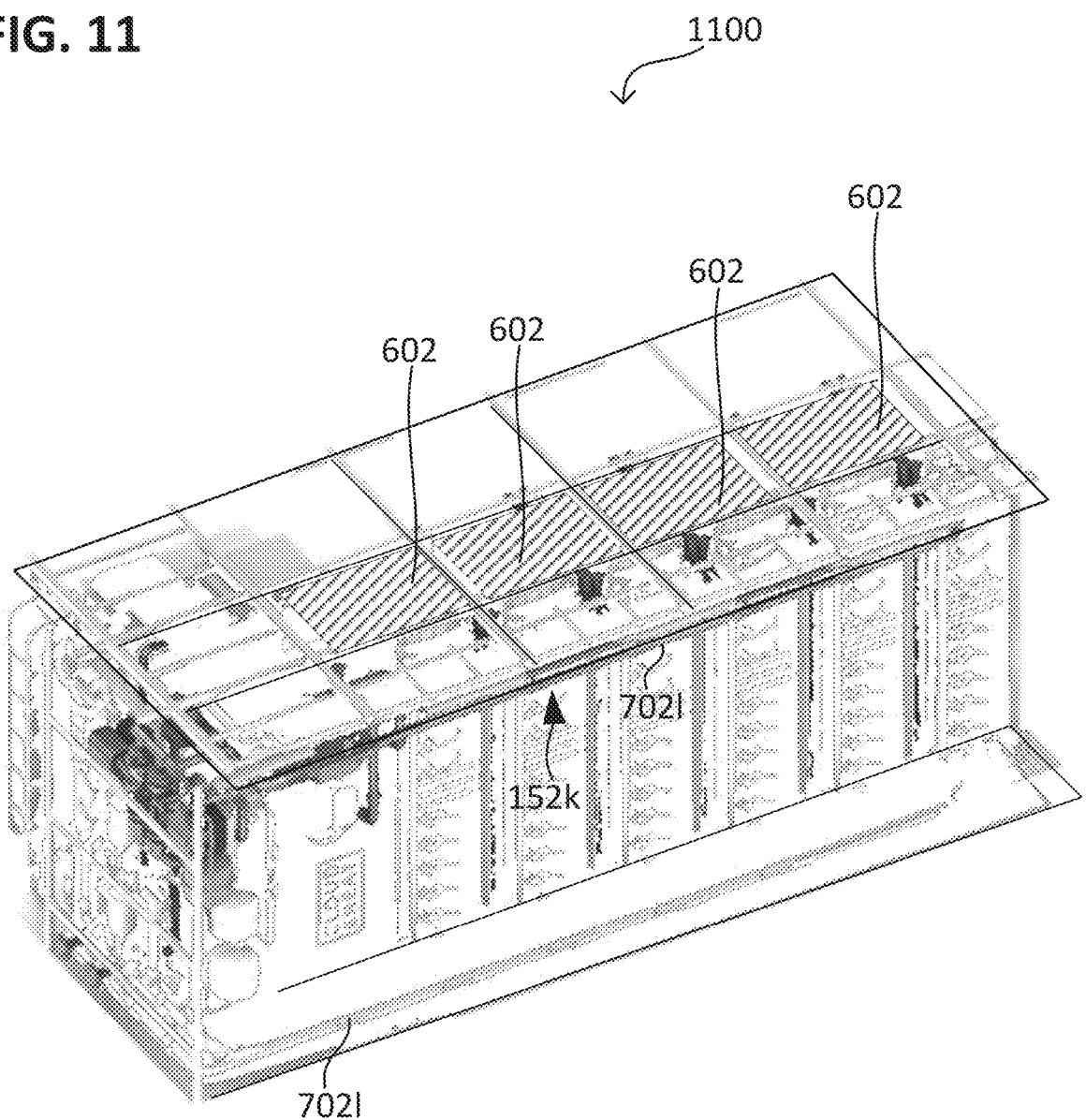

FIG. 10 and FIG. 11 each illustrate a container CC 151 according to various embodiments in a schematic perspective view 1000, 1100, highlighting components of the hot liquid circuit 152*h* and the cold liquid circuit 152*k*, respectively.

Figure 12:
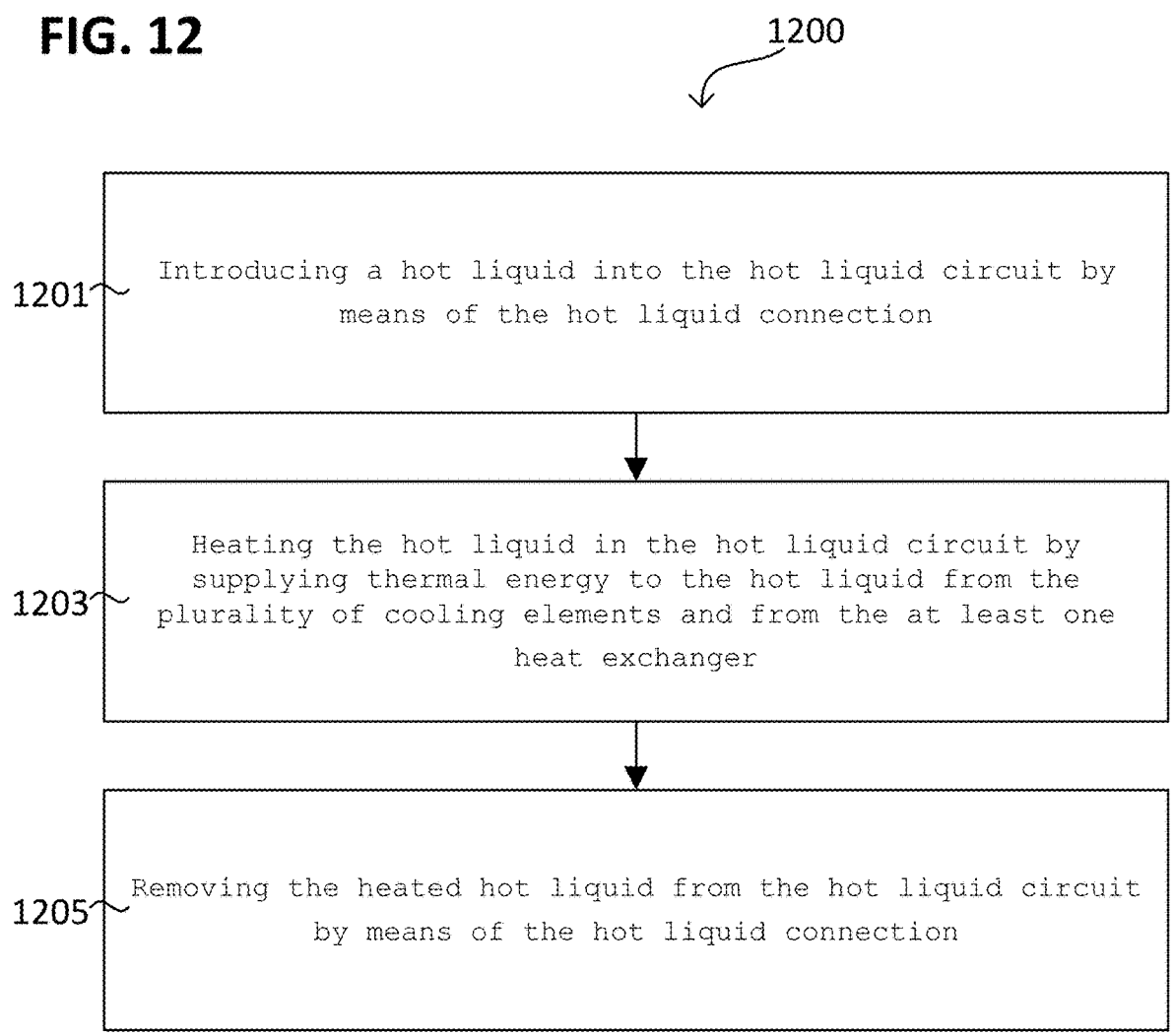

FIG. 12 illustrates a method 1200 according to various embodiments in a schematic flowchart.

The method 1200 may comprise: in 1201, introducing a hot liquid into the hot liquid circuit by means of the hot liquid connection; in 1203, heating the hot liquid in the hot liquid circuit by supplying thermal energy to the hot liquid from the plurality of cooling elements and from the at least one heat exchanger; in 1205, removing the heated hot liquid from the hot liquid circuit by means of the hot liquid connection.

Figure 13:
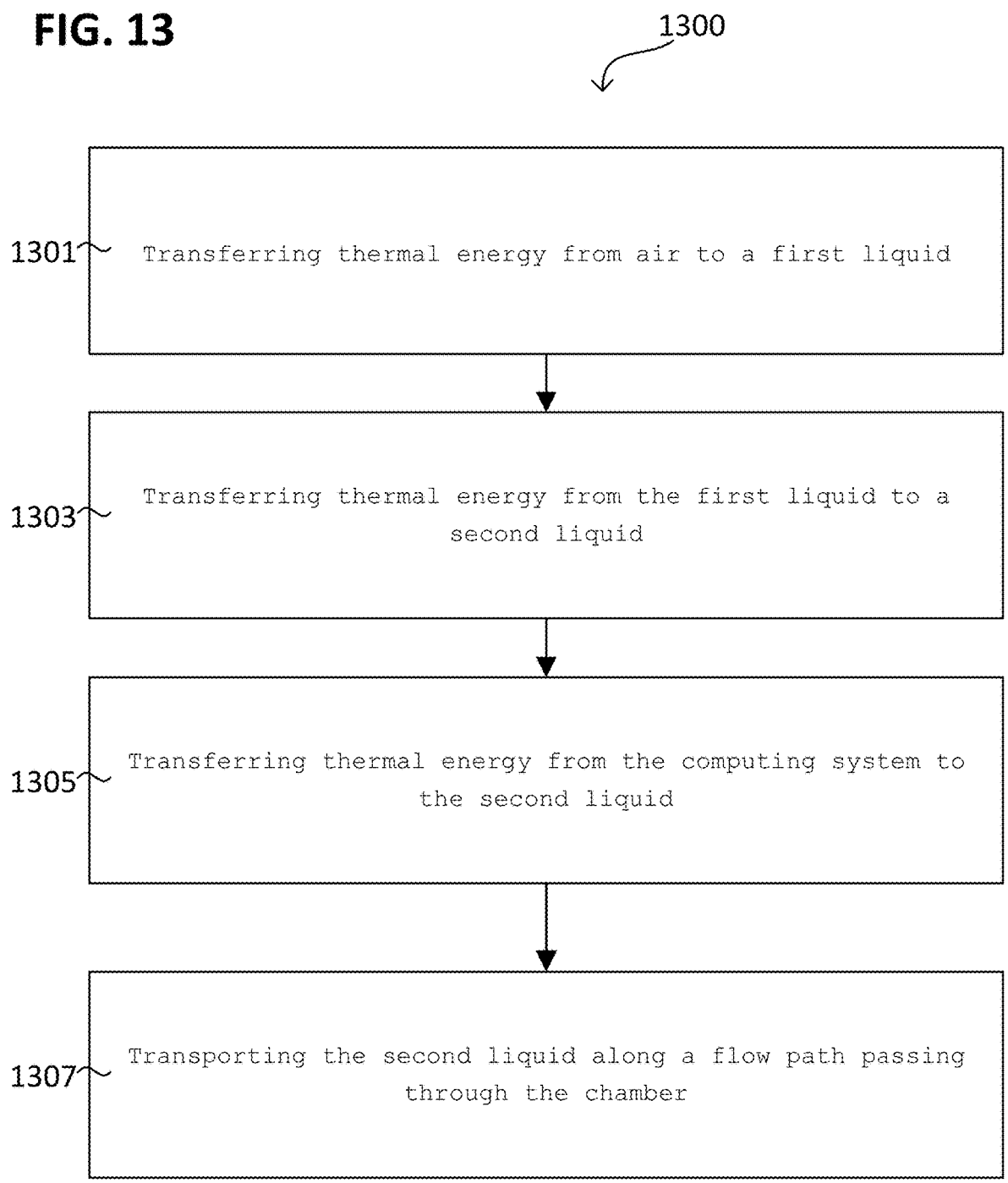

FIG. 13 illustrates a method 1300 according to various embodiments in a schematic flowchart.

The method 1200 may comprise: in 1301, first transferring thermal energy from air to a first liquid (also referred to as a cold liquid), the air being disposed in a chamber in which computing system is also disposed (and, for example, a heat pump is disposed), the computing system and/or the heat pump being, for example, in contact with the air; in 1303, second transferring thermal energy from the first liquid to a second liquid (also referred to as a hot liquid) having a greater temperature than the first liquid, for example, by means of the heat pump; in 1305, third transferring thermal energy from the computing system (e.g., its processors) to the second liquid; and in 1307, transporting the second liquid along a flow path passing through the chamber.

The transporting may comprise: bringing the second liquid out of the chamber and bringing the second liquid back into the chamber along the flow path. The flow path may be, for example, self-contained. For example, the cold liquid may be conveyed (e.g., only) along an additional flow path disposed within the chamber.

For example, the first transmit, the second transmit, and/or the third transmit may occur within the chamber 102.

FIG. 14 illustrates a method 1400 according to various embodiments in a schematic flowchart comprising, for example, method 1200 and/or method 1300.

The method 1400 may comprise, in 1401: Controlling and/or regulating a temperature (also referred to as hot temperature) of the hot liquid, e.g., according to a specification. Controlling and/or regulating the hot temperature may comprise: Increasing the flow rate of hot liquid through the at least one heat pump when the hot temperature meets the specification (e.g., is equal to or greater than a target temperature); and/or decreasing the flow rate of hot liquid through the at least one heat pump when the hot temperature does not meet the specification.

Alternatively or additionally, the method 1400 in 1403 may comprise: Controlling and/or regulating a temperature (also referred to as a room temperature) of air within the chamber. Controlling and/or regulating the room temperature may comprise: Increasing an electrical power input of at least one heat pump when the room temperature meets the specification (e.g., is equal to or greater than a target temperature); and/or decreasing the electrical power input when the room temperature does not meet the specification. For example, the electrical power consumption may be changed using an actuator of the heat pump. The actuator may, for example, set one or more than one working parameter of the heat pump, which defines the working point of the heat pump. The working parameter may be, for example, a pumping rate of the heat pump. The at least one heat pump may thermally couple the hot liquid to the cold liquid.

Alternatively or additionally, controlling and/or regulating the room temperature may comprise: Controlling the cold liquid circuit 152*k* according to a set temperature (e.g., of air within the chamber 102); switching the set temperature according to a maintenance mode and a normal mode, wherein the set temperature according to the maintenance mode is less than 35° C. and the set temperature according to the normal mode is greater than about 35° C. (e.g., than 40° C. or than 45° C. or than 50° C. or than 55° C.). The actual temperature may be captured, for example, using one or more than one temperature sensor. The switching may occur, for example, according to an input at a user interface, remotely, and/or in response to a person being captured within the chamber 102.

In the following, various examples are described that relate to what has been described above and what is shown in the figures.

Example 1 is a computing center, comprising: a computing system disposed in a chamber, the computing system comprising a plurality of cooling elements and a plurality of processors, each processor thermally coupled to a cooling element of the plurality of cooling elements; at least one heat pump disposed in the chamber; at least one gas-liquid exchanger disposed in the chamber; a hot liquid circuit coupling the plurality of cooling elements to the gas-liquid exchanger, the hot liquid circuit further comprising a hot liquid connection on a wall of the chamber; and a cold liquid circuit coupling the heat pump to the gas-liquid exchanger; wherein the heat pump is adapted to extract thermal energy from the cold liquid circuit and supply it to the hot liquid circuit.

Example 2 is the computing center according to example 1, wherein the chamber is set up as a container, for example, wherein the container is set up as a container according to ISO standard 668.

Example 3 is the computing center of any of Examples 1 or 2, further comprising: a hot liquid supply outside the chamber, the hot liquid supply coupled to the hot liquid connection.

Example 4 is the computing center according to Example 3, wherein a self-contained flow path through the hot liquid circuit is provided by means of the hot liquid supply.

Example 5 is the computing center according to any one of examples 1 to 4, wherein a flow path is provided from the hot liquid connection through the plurality of cooling elements and the heat exchanger back to the hot liquid connection by means of the hot liquid circuit.

Example 6 is the computing center according to any of Examples 1 to 5, further comprising: a secondary air system within the chamber arranged to provide airflow to the gas-liquid exchanger, for example by means of a fan.

Example 7 is the computing center shown in Example 6, with airflow circulating only within the chamber.

Example 8 is the computing center according to any of Examples 1 to 7, wherein the gas-liquid exchanger is arranged to exchange thermal energy between a gas within the chamber and the cold liquid circuit.

Example 9 is the computing center according to any of examples 1 to 8, wherein a heat pump of the at least one heat pump is set up with a modulatable operating point.

Example 10 is the computing center according to example 9, wherein the heat pump comprises an actuator that modulates the operating point, wherein the actuator may switch between at least two states (e.g., at least three states and/or continuously) according to which the operating point is provided.

Example 11 is the computing center according to any one of examples 1 to 10, further comprising: a power supply infrastructure within the chamber for supplying electrical power to the computing system.

Example 12 is the computing center of example 11, wherein the power supply infrastructure of the chamber is pre-certified with respect to a reliability of the computing system; and/or wherein the gas-liquid exchanger is arranged to extract thermal energy from the power supply infrastructure (e.g., by means of airflow within the chamber).

Example 13 is the computing center according to any of Examples 1 to 12, wherein a cooling infrastructure of the chamber comprising the heat pump, the gas-liquid exchanger, the hot liquid circuit, and the cold liquid circuit is pre-certified with respect to a reliability of the computing system.

Example 14 is the computing center according to any of Examples 1 to 13, wherein the hot liquid circuit comprises at least one expansion tank, such as a membrane expansion tank.

Example 15 is the computing center according to any one of examples 1 to 14, further comprising: a failure switch, wherein the at least one heat pump comprises a pair of heat pumps set up to be redundant to each other; wherein the failure switch is arranged to switch to the other heat pump of the pair in response to a failure of one heat pump of the pair.

Example 16 is the computing center according to any of Examples 1 to 15, wherein the chamber is arranged such that an air circulation area of the chamber to which the computing system and/or the heat exchanger is adjacent is hermetically sealed from an exterior of the enclosure.

Example 17 is the computing center of example 16, wherein the enclosure includes a plurality of side walls surrounding the interior, each side wall including thermal insulation (e.g., comprising an insulating material).

Example 18 is the computing center according to any one of Examples 1 to 17, wherein the hot liquid circuit is arranged such that, in use, a hot liquid temperature of the hot liquid circuit (i.e., a temperature of the hot liquid) is greater than a cold liquid temperature of the cold liquid circuit (i.e., a temperature of the cold liquid).

Example 19 is the computing center of Example 18, wherein the hot liquid temperature delivered from the hot liquid circuit by means of the hot liquid connection is in a range from about 55° C. to about 80° C.; and/or wherein the hot liquid temperature received from the hot liquid circuit by means of the hot liquid connection is in a range from about 5° C. to about 55° C.; and/or wherein the cold liquid temperature is in a range from about 10° C. to about 50° C.

Example 20 is the computing center according to any one of examples 1 to 19, further comprising: a control device configured to control a flow of the hot liquid circuit according to the hot liquid temperature and/or the at least one heat pump according to the cold liquid temperature, for example, the control device being configured to switch the cold liquid temperature between at least two temperatures, for example, the control device being configured to switch the cold liquid temperature according to an operating state (e.g., between normal operation and maintenance operation) of the computing center.

Example 21 is the computing center according to any of Examples 1 to 20, wherein the computing system comprises a plurality of racks, each rack holding a plurality of processors of the plurality of processors.

Example 22 is the computing center according to any of Examples 1 to 21, wherein each rack is arranged to hold more than 30 processors per square meter of computing system (e.g., rack) floor area.

Example 23 is the computing center according to any of Examples 1 to 22, wherein a thermal power extraction capability of the hot liquid circuit is greater than a maximum electrical power consumption of the computing center.

Example 24 is the computing center according to any of Examples 1 to 23, wherein the cold liquid circuit is hermetically sealed to the outside of the chamber.

Example 25 is a method of operating a computing center according to any one of examples 1 to 24, the method comprising: introducing a hot liquid into the hot liquid circuit by means of the hot liquid connection; heating the hot liquid in the hot liquid circuit by supplying thermal energy to the hot liquid from the plurality of cooling elements and from the at least one heat exchanger; removing the heated hot liquid from the hot liquid circuit by means of the hot liquid connection.

Example 26 is the method of Example 25, wherein a temperature of the hot liquid brought out of the hot liquid circuit is in a range of about 55° C. to about 80° C.; and/or wherein the temperature of the hot liquid brought into the hot liquid circuit is in a range of about 5° C. to about 55° C.

Example 27 is a method comprising: first transferring thermal energy from air to a first liquid, the air being disposed in a chamber in which is further disposed a computing system (and, e.g., a heat pump); second transferring thermal energy from the first liquid to a second liquid having a higher temperature than the first liquid, e.g., by means of the heat pump; third transferring thermal energy from the second liquid to the first liquid, e.g., by means of the heat pump; and second transferring thermal energy from the first liquid to a second liquid having a greater temperature than the first liquid, for example by means of the heat pump; third transferring thermal energy from the computing system to the second liquid; bringing the second liquid out of the chamber and bringing the second liquid back into the chamber along a self-contained flow path.

The invention claimed is:

1. A computing center, comprising:
   a computing system disposed in a chamber, the computing system comprising a plurality of cooling elements and a plurality of processors, wherein each processor is thermally coupled to a cooling element of the plurality of cooling elements;
   at least one heat pump arranged in the chamber;
   at least one gas-liquid exchanger arranged in the chamber;
   a hot liquid circuit coupling the plurality of cooling elements to the at least one heat pump, the hot liquid circuit further comprising a hot liquid connection on a wall of the chamber, wherein the hot liquid circuit is configured to remove thermal energy from the chamber through the hot liquid connection; and
   a cold liquid circuit coupling the heat pump to the gas-liquid exchanger
   wherein the heat pump is configured to extract thermal energy from the cold liquid circuit and supply it to the hot liquid circuit.

2. The computing center according to claim 1, wherein the chamber is configured as a container.

3. The computing center according to claim 2, wherein the container is configured as a container according to ISO standard 668.

4. The computing center according to claim 1, the computing center further comprising:
   a hot liquid supply external to the chamber, the hot liquid supply coupled to the hot liquid connection.

5. The computing center according to claim 4, wherein a self-contained flow path is provided through the hot liquid circuit by means of the hot liquid supply.

6. The computing center according to claim 1, wherein a heat pump of the at least one heat pump is configured with a modulatable operating point.

7. The computing center according to claim 1, the computing center further comprising:
   a power supply infrastructure within the chamber for supplying electrical power to the computing system, wherein the power supply infrastructure of the chamber is pre-certified with respect to a reliability of the computing system.

8. The computing center according to claim 1, wherein a cooling infrastructure comprising the heat pump, the gas-liquid exchanger, the hot liquid circuit, and the cold liquid circuit is pre-certified with respect to a reliability of the computing system.

9. The computing center according to claim 1, the computing center further comprising:
   a failure switch,
   wherein the at least one heat pump comprises a pair of mutually redundant heat pumps
   wherein the failure switch is configured to switch to another heat pump of the pair of mutually redundant heat pumps in response to a failure of one heat pump of the pair of mutually redundant heat pumps.

10. The computing center according to claim 1, wherein the chamber is configured such that an air circulation area of the chamber, to which the computing system and/or the heat exchanger is adjacent, is hermetically sealed with respect to an exterior of the chamber.

11. The computing center according to claim 1, wherein the hot liquid circuit is configured such that, in operation, a hot liquid temperature of the hot liquid circuit is greater than a cold liquid temperature of the cold liquid circuit.

12. The computing center according to claim 11, the computing center further comprising:
   a control device configured to control a flow of the hot liquid circuit according to the hot liquid temperature and/or the at least one heat pump according to the cold liquid temperature.

13. The computing center according to claim 12, wherein the control device is configured to switch the cold liquid temperature between at least two temperatures.

14. The computing center according to claim 13, wherein the control device is configured to switch the cold liquid temperature according to an operating condition of the computing center.

15. The computing center according to claim 1, the computing center further comprising a secondary air system within the chamber configured to provide airflow to the gas-liquid exchanger.

16. The computing center according to claim 6, wherein the secondary air system is configured to circulate the airflow only within the chamber.

17. The computing center according to claim 1, wherein the chamber comprises an air circulation area adjacent to the computing system and/or the heat exchanger, wherein the air circulation area is hermetically sealed.

18. The computing center according to claim 1, wherein a thermal power extraction capability of the hot liquid circuit is greater than a maximum electrical power consumption of the computing center.

* * * * *